(12) United States Patent
Manohar et al.

(10) Patent No.: US 9,633,157 B2
(45) Date of Patent: Apr. 25, 2017

(54) ENERGY-EFFICIENT PIPELINE CIRCUIT TEMPLATES FOR HIGH-PERFORMANCE ASYNCHRONOUS CIRCUITS

(75) Inventors: Rajit Manohar, New York, NY (US); Basit Riaz Sheikh, Islamabad (PK)

(73) Assignee: CORNELL UNIVERSITY, Ithaca, NY (US)

( * ) Notice: Subject to any disclaimer, the term of this patent is extended or adjusted under 35 U.S.C. 154(b) by 438 days.

(21) Appl. No.: 14/236,903

(22) PCT Filed: Aug. 3, 2012

(86) PCT No.: PCT/US2012/049653
§ 371 (c)(1),
(2), (4) Date: Jul. 22, 2014

(87) PCT Pub. No.: WO2013/020114
PCT Pub. Date: Feb. 7, 2013

(65) Prior Publication Data
US 2014/0372784 A1 Dec. 18, 2014

Related U.S. Application Data

(60) Provisional application No. 61/514,589, filed on Aug. 3, 2011, provisional application No. 61/515,387, filed on Aug. 5, 2011.

(51) Int. Cl.
*G06F 17/50* (2006.01)
*G06F 9/38* (2006.01)
*G06F 1/12* (2006.01)

(52) U.S. Cl.
CPC ............ *G06F 17/5059* (2013.01); *G06F 1/12* (2013.01); *G06F 9/3869* (2013.01); *G06F 9/3871* (2013.01)

(58) Field of Classification Search
CPC ............... G06F 9/3869; G06F 17/5059; G05B 19/0423; G05B 2219/21008
USPC ........................................................ 713/375
See application file for complete search history.

(56) References Cited

U.S. PATENT DOCUMENTS 5,903,570 A   5/1999 Van Berkel
6,381,692 B1  4/2002 Martin et al.
(Continued)

FOREIGN PATENT DOCUMENTS

CN   1471668 A   1/2004
CN   1902580 A   1/2007
(Continued)

OTHER PUBLICATIONS

Yun, B. S., Authorized Officer, Korean Intellectual Property Office, International Search Report, International Application No. PCT/US2012/049653, Dec. 27, 2012, 7 pages.
(Continued)

*Primary Examiner* — Thomas Lee
*Assistant Examiner* — Santosh R Poudel
(74) *Attorney, Agent, or Firm* — Perkins Coie LLP

(57) ABSTRACT

Asynchronous circuits and techniques are described for asynchronous processing without synchronization to a common clock. Two specific energy-efficient pipeline templates for high throughput asynchronous circuits are provided as examples based on single-track handshake protocol. Each pipeline contains multiple stages of logic. The handshake overhead is minimized by eliminating validity and neutrality detection logic gates for all input tokens as well as for all intermediate logic nodes. Both of these templates can pack significant amount of logic within each pipeline block, while still maintaining a fast cycle time.

36 Claims, 15 Drawing Sheets

(56) References Cited

U.S. PATENT DOCUMENTS

| | | | |
|---|---|---|---|
| 7,746,102 B1* | 6/2010 | Young | G06F 9/3869 326/38 |
| 2002/0156995 A1 | 10/2002 | Martin et al. | |
| 2002/0188912 A1* | 12/2002 | Kondratyev | G06F 17/5059 716/103 |
| 2004/0025074 A1* | 2/2004 | Singh | G06F 9/3871 713/400 |
| 2006/0120189 A1 | 6/2006 | Beerel et al. | |
| 2008/0168407 A1 | 7/2008 | Manohar | |
| 2009/0119631 A1* | 5/2009 | Cortadella | H03K 19/20 716/113 |
| 2009/0288059 A1* | 11/2009 | Dimou | G06F 17/5059 716/104 |
| 2010/0303067 A1* | 12/2010 | Manohar | H04L 49/25 370/386 |
| 2011/0029941 A1* | 2/2011 | Dimou | G06F 17/505 716/101 |
| 2011/0204932 A1* | 8/2011 | Cortadella | G06F 7/00 327/145 |

FOREIGN PATENT DOCUMENTS

| | | |
|---|---|---|
| CN | 1926799 A | 3/2007 |
| CN | 101258463 A | 9/2008 |

OTHER PUBLICATIONS

State Intellectual Property Office of PRC, Office Action, Chinese Patent Application No. 201280046588.3, Dec. 4, 2015.

* cited by examiner

ENERGY-EFFICIENT PIPELINE CIRCUIT TEMPLATES FOR HIGH-PERFORMANCE ASYNCHRONOUS CIRCUITS

PRIORITY CLAIMS AND RELATED APPLICATIONS

This patent document is a 35 U.S.C. §371 National Stage application of International Application No. PCT/US2012/049653 filed Aug. 3, 2012, which claims priority under 35 U.S.C. §119 of U.S. Provisional Application No. 61/514,589, filed Aug. 3, 2011, entitled "Energy-Efficient Pipeline Templates for High-Performance Asynchronous Circuits" and U.S. Provisional Application No. 61/515,387, filed Aug. 5, 2011, entitled "Energy-Efficient Pipeline Templates for High-Performance Asynchronous Circuits." The entire disclosures of the above applications are incorporated herein by reference as part of this patent document.

FEDERALLY SPONSORED RESEARCH OR DEVELOPMENT

This invention was made with government support under grants CNS-0834582 and CCF-0428427 awarded by National Science Foundation (NSF). The government has certain rights in the invention.

BACKGROUND

Integrated circuits for signal processing can be configured as synchronous circuits and asynchronous circuits. A synchronous circuit operates based on a control clock signal to synchronize operations of different processing components within the synchronous circuit. Different processing components in a synchronous circuit usually operate at different speeds. Synchronization of these different processing components tends to require the clock speed of the control clock signal to accommodate for the slowest processing speed of the processing components. Many digital processors are such synchronous processing devices, including various microprocessors used in personal computers, mobile phones, mobile computing devices and other devices performing digital signal processing. The speed of a synchronous processor can be increased by increasing the clock speed which forcing faster execution of instructions.

Most synchronous digital processors are built based on CMOS technology. The scaling of CMOS technology into ultra-deep sub-micron range has posed some serious challenges for digital circuits designers. With the transistor threshold voltage fixed [Horowitz 2007], VDD has been scaling slowly as the transistor reduces in size. Therefore, the circuit performance improvements come at an increased energy consumption. The energy efficiency issue has become a major design constraint in modern chip design. Furthermore, process variations in deep sub-micron range have made devices less robust and this issue increasingly makes it difficult for synchronous designers to overcome the problems associated with clock skew rates and clock distribution [Dally and Poulton 1998].

An asynchronous circuit, on the other hand, eliminates synchronization of different processing components to a common clock signal by operating different processing components as fast as permitted by their structures and operating environments or conditions. Two processing components in a pipeline within an asynchronous circuit communicate with each other via handshake signaling. Such an asynchronous processor can be optimized for fast processing by pipelining techniques based on unique properties of asynchronous processing, can be configured to have lower design complexity, enhanced energy efficiency, and improved average-case performance. Some features and advantages of asynchronous circuits are described in an article entitled "A Case for Asynchronous Computer Architecture" and published by Rajit Manohar of Cornell University in 2000.

SUMMARY

Asynchronous circuits and techniques are described.

In one aspect, a method for asynchronous processing without synchronization to a common clock is provided to include connecting asynchronous circuits in series to form an asynchronous processing pipeline to allow one asynchronous circuit to communicate with next adjacent asynchronous circuit to communicate while permitting each asynchronous circuit to perform signal processing, without a common clock. This method further includes operating two adjacently connected asynchronous circuits in the asynchronous processing pipeline to communicate by directing signals from one of the two adjacently connected asynchronous circuits that is upstream relative to the other asynchronous circuit without having an acknowledgment feedback from the downstream asynchronous circuit to the upstream asynchronous circuit; operating each asynchronous circuit to encode an input or output signal by using a plurality of conductive wires to carry the input or output signal and by having only a single wire of the plurality of conductive wires asserted at a time; and operating each asynchronous circuit to use a single conductive wire, which is additional to the conductive wires for carrying output signal from the upstream asynchronous circuit to the downstream asynchronous circuit, to send an acknowledgment signal to the downstream asynchronous circuit.

In another aspect, a device for asynchronous processing without synchronization to a common clock is provided to include two or more asynchronous circuits that are connected to form an asynchronous processing pipeline. Each asynchronous circuit includes input conductive wires that receive and carry an input signal, an input acknowledgment conductive wire that receives an input acknowledgment signal from an upstream asynchronous circuit that produces the received input signal, an asynchronous processing module that processes the input signal to produce an output signal, a completion detection processing module that receives the input acknowledgment signal and the output signal and is operable to produce an output acknowledgment signal indicating completion of processing of the received input signal and generation of the output signal; an output acknowledgment conductive wire that receives the output acknowledgment signal from the completion detection processing module and outputs the output acknowledgment signal; and output conductive wires that receive and carry the output signal generated by the asynchronous processing module.

Various implementations of the above and other aspects are described. For example, two examples of energy-efficient pipeline templates are provided for high throughput asynchronous circuits. The templates of these teachings, called N-P and N-Inverter pipelines, use single-track handshake protocol. There are multiple stages of logic within each pipeline. The techniques of these teachings limit handshake overheads associated with input tokens and intermediate logic nodes within a pipeline template. Each template can pack significant amount of logic in a single stage, while still maintaining a fast cycle time of only 18 transitions. Noise and timing robustness constraints of our pipelined circuits are quantified across all process corners. A completion detection scheme based on wide NOR gates is presented, which results in significant latency and energy savings especially as the number of outputs increase. To fully quantify all design trade-offs, three separate pipeline implementations of an 8×8-bit booth-encoded array multiplier are presented. Compared to some other QDI pipeline implementations, the N-Inverter and N-P pipeline implementations reduced the energy-delay product by 38.5% and 44% respectively. The overall multiplier latency was reduced by 20.2% and 18.7%, while the total transistor width was reduced by 35.6% and 46% with N-Inverter and N-P pipeline templates respectively.

These and other aspects and their implementations of described asynchronous processing are described in greater detail in the drawings, the description and the claims.

BRIEF DESCRIPTION OF THE DRAWINGS

FIG. 14 8-to-1 multiplexor with 2 copies of Output.
FIG. 15 8-to-1 multiplexor design trade-offs for different pipeline styles.
FIG. 20 8×8-bit multiplier architecture using PCeHB pipelines.
FIG. 21 8×8-bit multiplier using N-P pipelines.
FIG. 23 8×8-bit multiplier throughput vs energy for three different pipeline styles.
FIG. 24 8×8-bit Multiplier energy-delay analysis for three different pipeline styles.

DETAILED DESCRIPTION

Figure 1:
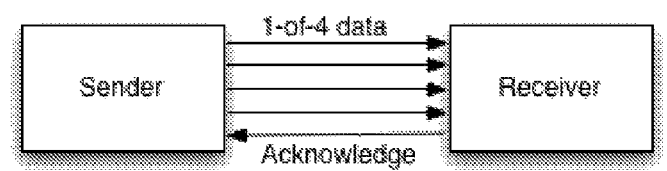
FIG. 1 Asynchronous pipelines: sender-receiver handshake protocol.

Asynchronous quasi-delay-insensitive (QDI) circuits, with their robustness to process variations, no global clock dependence, and inherent perfect clock gating, represent a feasible design alternative for future chip designs. The QDI circuits have been used in numerous high-performance, energy-efficient asynchronous designs [Sheikh and Manohar 2010] [D. Fang and Manohar 2005], including a fully implemented and fabricated asynchronous microprocessor [Martin et al. 1997]. QDI circuits lose some of their energy efficiency gains in implementing handshakes between different parallel pipeline processes. To ensure QDI behavior for each handshake, every up and down transition within a pipeline is sensed, which leads to significant handshake circuitry and energy overhead. High throughput QDI pipelines only include a small amount of logic in each stage. The large number of pipeline stages required for high throughput make the handshake overhead a significant proportion of the total power consumption. The technology described in this document can be implemented in ways that improve the energy efficiency of high performance asynchronous pipelines but without sacrificing robustness. To circumvent the problem of high handshake overhead, two exemplary pipeline templates are provided to minimize the handshake circuitry by taking advantage of some easily satisfiable timing assumptions. The pipelines of these teachings use single-track handshake protocols [van Berkel and Bink 1996]. Logic density is enhanced by packing multiple logic stages in a single pipeline, while still maintaining a very fast cycle time of 18 transitions. To quantify actual performance and energy efficiency of the pipeline templates of theses teachings, three separate pipeline implementations of an 8×8-bit booth-encoded array multiplier are presented. Compared to a standard QDI pipeline implementation, our pipeline implementations reduced the energy-delay product by 38.5% and 44% respectively. The overall multiplier latency was reduced by 20.2% and 18.7%, while the total transistor width was reduced by 35.6% and 46% with the use of the N-Inverter and N-P pipeline templates of these teachings, respectively.

High performance asynchronous circuits are composed of many parallel processes. As opposed to synchronous circuits, which use a global clock to synchronize data tokens between different pipeline stages, these asynchronous parallel processes use handshake protocols to communicate with each other. These parallel processes are often referred to as fine-grain pipelined circuits. The fine-grain pipelined circuits use designated channels for communication between processes. A channel comprises a bundle of wires and a communication protocol to transmit data from a sender to a receiver. There are numerous asynchronous fine-grain pipeline implementations [Lines 1995] [Williams 1991] [Sutherland and Fairbanks 2001] [Ferretti and Beerel 2002]. A robust family of these circuit templates is referred to as quasi-delay-insensitive (QDI) circuits.

QDI circuit templates use 1-of-N encoded channels to communicate between different parallel processes. In an 1-of-N channel, a total of N wires is used to encode data with only one wire asserted at a time. Most high throughput QDI circuits either use 1-of-2 (dual-rail) or 1-of-4 encodings. In an 1-of-4 encoded channel communication as shown in FIG. 1, validity is signified by the setting one of the four data rails and neutrality is indicated by the reset of all four data rails. In a four phase handshake process, which is commonly used in most high speed QDI circuits, the sender process initiates the communication by sending data over the rails i.e. by asserting one of the data rails. The receiver process detects the presence of data and sends an acknowledge once it no longer needs the data. At this point, the sender process resets all its data rails. The receiver process detects the neutrality of input tokens. It de-asserts the acknowledge signal once it is ready to receive a new data token. The cycle repeats.

Figure 2:
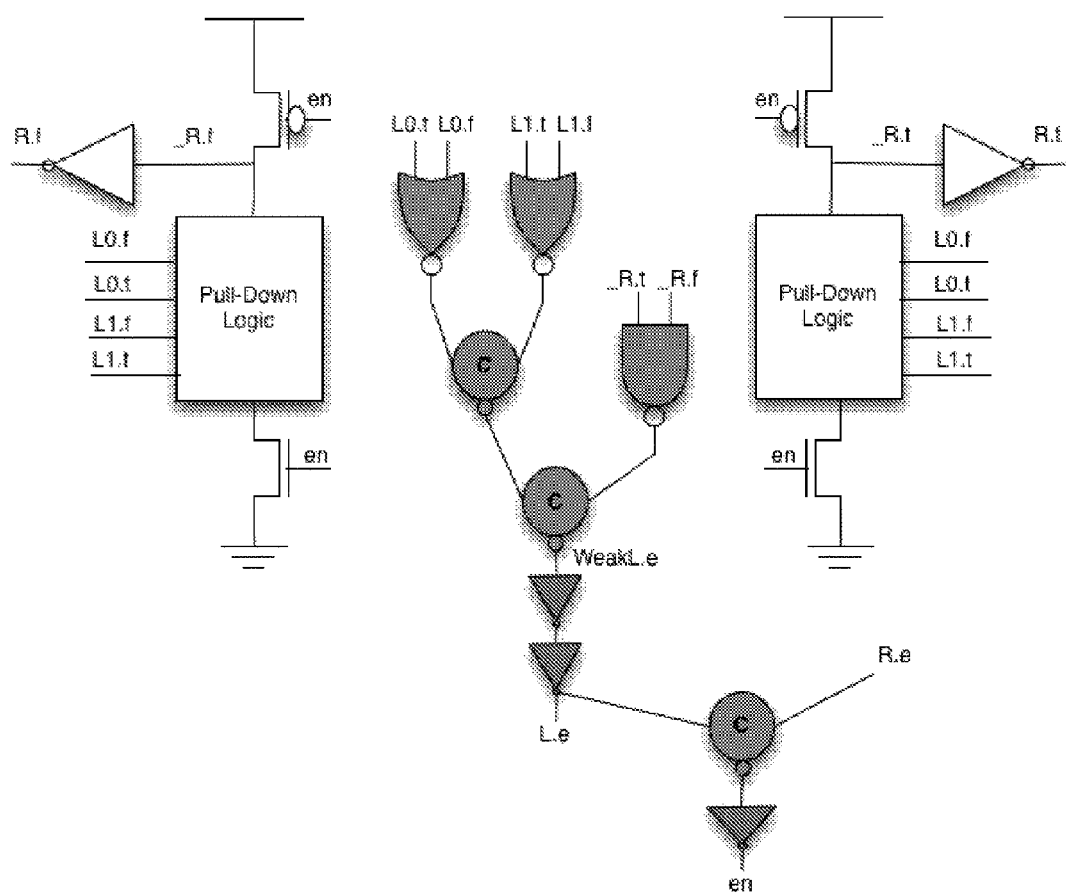
FIG. 2 A two input and one output PCeHB template.

The pre-charge enable half-buffer (PCeHB) [Fang and Manohar 2004] template, which is a slightly modified version of pre-charge halfbuffer (PCHB) template proposed in [Lines 1995] [Williams 1991], is a workhorse for most high throughput QDI circuits. It is both small and fast with a cycle time of 18 transitions. In a PCeHB pipeline, the logic function being computed is implemented by a pull-down NMOS stack. The input and output validity and neutrality are checked using separate logic gates. The actual computation is combined with data latching, which removes the overhead of explicit registers. A PCeHB template can take multiple inputs and produce multiple outputs. FIG. 2 shows a simple two input and one output PCeHB template. L0 and L1 are dual-rail inputs to the template and R is a dual-rail output. A PCeHB template has a forward latency of two transitions. Each pipeline stage computes logic by using a NMOS pulldown stack followed by an inverter to drive the output. To understand the cycle time of 18 transitions in a PCeHB template, let us assume two PCeHB pipelines in series with time (t) increments taken in terms of logic transitions.

At t=0, input tokens arrive at the first PCeHB pipeline block.
At t=2, first pipeline block produces its output.
At t=4, second pipeline block produces its output.
At t=5, L.e in the first block goes low.
At t=7, L.e in the following block, which is the R.e of the first block, goes low. This indicates that the output from the first pipeline block is no longer needed and can be reset.
At t=9, en signal in the first block is de-asserted.
At t=10, R rails in the first block are pre-charged.
At t=11, output, R, rails of the first block are reset.
At t=12, R rails in the second block are pre-charged.
At t=14, L.e in the first block goes high.
At t=16, L.e in the second pipeline stage goes high. This indicates the neutrality of the inputs in the second pipeline stage.
At t=18, en is set in the first pipeline block, which indicates that the pipeline is ready to accept new input tokens and compute a new output.

The highlighted logic gates in FIG. 2 are not used for the actual computation but are only required for the handshake protocol. This includes the generation of completion detection signal (L.e) as well as the en signal that is used to enable computation or latching in the pipeline stage. As the number of inputs into a PCeHB pipeline stage increases, the input validity tree becomes more complex and may require extra stages to compute, which leads to an increase in the cycle time. The same holds true as the number of outputs increase. Hence, for high-throughput circuits each PCeHB stage contains only a small amount of logic with only a few inputs and outputs. This leads to significant handshake overhead, in terms of power consumption and transistor count, as tokens may have to be copied for use in separate processes with each process doing its own validity and neutrality checks. Table I shows the power consumption breakdown of a simple full-adder circuit implemented using a PCeHB template. Only 31% of the total power is consumed in the actual logic, while the rest is spent in implementing the handshake protocol. This is a significant power overhead, which gets worse as the complexity of PCeHB templates increases with more inputs and outputs. The result in Table I was one of the main motivating factors that prompted us to consider alternative pipeline solutions with less handshake circuitry.

The fine-grain bundled-data pipelines have an instant area advantage over the QDI pipelines because of their use of single-rail encoded data channels [Sutherland and Fairbanks 2001]. However, the bundled-data pipelines include far more timing assumptions than QDI circuits which makes them less robust. The bundled-data pipelines contain a separate control circuitry to synchronize data tokens between different pipeline stages. The control circuitry includes a matched delay line, the delay of which is set to be larger than that of the pipeline's logic delay plus some margin. In [Sutherland and Fairbanks 2001], for correct operation, the designer has to ensure that the control circuit delay satisfies all set-up and hold time requirements just like in synchronous design. Since our goal was to design pipeline templates with robust timing and with forward latency similar to that of precharged logic, we did not consider any bundled-data pipeline implementations in our work.

TABLE I

PCeHB full-adder pipeline: power breakdown.

| Circuit | Power |
| --- | --- |
| Logic | 31% |
| Handshake | 69% |

QDI circuits can be configured to be robust since each up and down transition within a QDI pipeline template can be sensed. But this robustness comes at the cost of significant power consumption in pipeline handshake circuitry as shown in Table I. The high handshake overhead is one of the serious constraints hampering the wide-range adoption of QDI circuits especially for logic operations with a large number of input and output signals, such as a 32-bit multiplier. In this work, we try to improve the energy efficiency of high performance asynchronous pipelines but without sacrificing robustness. To this end, we kept the following objectives for our resulting pipeline templates:

Keep the cycle time of each stage within 18 transitions.
Increase the ratio of logic to handshake. The handshake power overhead must account for less than 50% of total pipeline power.
No increase in the total transistor count is allowed.
All timing assumptions are either isochronic fork assumption [Martin 1990] or have at least the same timing margin as the half-cycle timing assumption [LaFrieda and Manohar 2009] according to which the difference in number of transitions between any two delay races must be at least 4.5 transitions.
Stalls on input and output should not impact correct operation. We envision these circuits being used for large chunks of local logic (e.g. a multiplier) wrapped with QDI interfaces, rather than globally. In the past, researchers have tried to increase the logic density of QDI pipelines by adding extra logic stages [Beerel et al. 2009], but this still does not yield the desired reduction in the handshake overhead and leads to an increase in cycle time. To analyze this effect, let us suppose we increase the logic depth of a pipeline by adding extra logic stages. To conform to QDI behavior, the up and down transitions of all newly-created internal signals must be acknowledged. This can be done either by explicitly checking for each transition using completion detection logic as is done in the PCeHB template or using weak conditions [Seitz 1980] i.e. the output being valid implies that the input is valid (checked by additional n-fets in the logic stack), and the output being neutral implies that the input is neutral (checked by additional p-fets in the logic stack). The limitations of weak conditions for performance are elaborated in [Seitz 1980] [Lines 1995]. In the case of explicit checking, there is the associated high handshake overhead because of all the extra validity and neutrality detection logic gates. All these extra transitions associated with the newly added logic stages and completion detection logic gates limit energy efficiency gains.

There is clearly a need to look beyond just adding extra logic stages to each pipeline stage. To improve the energy efficiency of high throughput asynchronous pipelines, we disclose alternative handshake protocols as well as some timing assumptions in QDI circuits.

Figure 3:
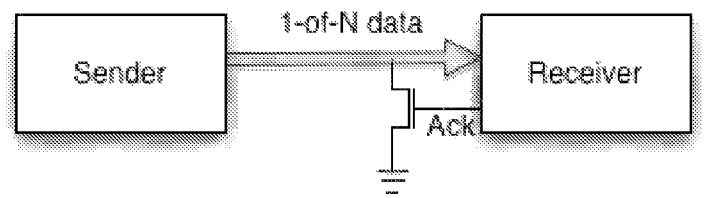
FIG. 3 Single-track handshake protocol.

In a four phase handshake protocol, the pipeline stage needs to detect the validity and the neutrality of both inputs and outputs. During the second half of the four-phase protocol when the pipeline is waiting for inputs and outputs to be reset, no actual logic is being computed but it still consumes roughly half of the cycle time. Furthermore, the power consumed in detecting the neutrality of inputs and outputs rivals that consumed during their validity detection. Due to these characteristics, the four phase handshake protocol is clearly not an ideal choice for energy efficiency. Single-track handshake [van Berkel and Bink 1996] protocol tries to overcome this weakness of four phase protocol by practically eliminating the neutrality phase. FIG. 3 shows an overview of a single-track handshake protocol. The sender process initiates the communication by sending the data token. The receiver uses the data for computing its logic. Once the data is no longer needed, instead of sending an acknowledge signal back to the sender process, the receiver process resets the input tokens itself by pulling the data wires low through NMOS transistors as illustrated in FIG. 3. There are as many NMOS discharge transistors as there are data wires, but for simplicity we show only one discharge transistor in FIG. 3. As the data wires pulled low, the sender detects the token consumption and gets ready to send the next token. Hence, eliminating the transitions associated with second part of the four phase protocol.

For single-track handshake templates, some prior work has focused on using single-track handshake protocol to reduce the cycle time of asynchronous pipelines to less than 10 transitions and not on how to use these extra transitions to improve logic density and energy efficiency. Ferretti et al [2002] provide a family of asynchronous pipeline templates based on single-track handshake protocol. Just like high throughput QDI circuits, each of their pipeline templates contains only a small amount of logic. Furthermore, their 6-transition cycle time pipelines use some very tight timing margins that may require significant post-layout analog verification. Single-track circuits have been used in the control path of GasP [Sutherland and Fairbanks 2001] bundled-data pipelines. However, the actual data path of the pipeline does not use a single-track handshake protocol.

The examples described here employ single-track handshake protocol for pipeline templates to increase the logic density and energy efficiency of each pipeline stage.

QDI circuits are highly tolerant of process variations as each transition within a QDI pipeline is sensed. The isochronic fork assumption [Martin 1990], which states that the difference in delay between branches of a wire is insignificant compared to the gate delays of the logic reading their values, is the only timing assumption allowed in QDI design. Recently, LaFrieda et al [2009] exposed another timing assumption that is quite commonly used in QDI implementations, which they named as the half cycle timing assumption (HCTA). According to HCTA, the difference in number of transitions between any two delay races must be at least 4.5 transitions for PCeHB-style templates. The resulting templates are referred to as Relaxed QDI templates and are shown to be quite robust. LaFrieda et al [2009] exploited HCTA to improve energy efficiency of their four phase handshake protocol pipelines. The technology described here can be implemented in ways that improve energy efficiency of single track handshake protocol pipelines by introducing timing assumptions with a margin of, in some example, at least 5 gate transitions between any two relative delay races.

Figure 4:
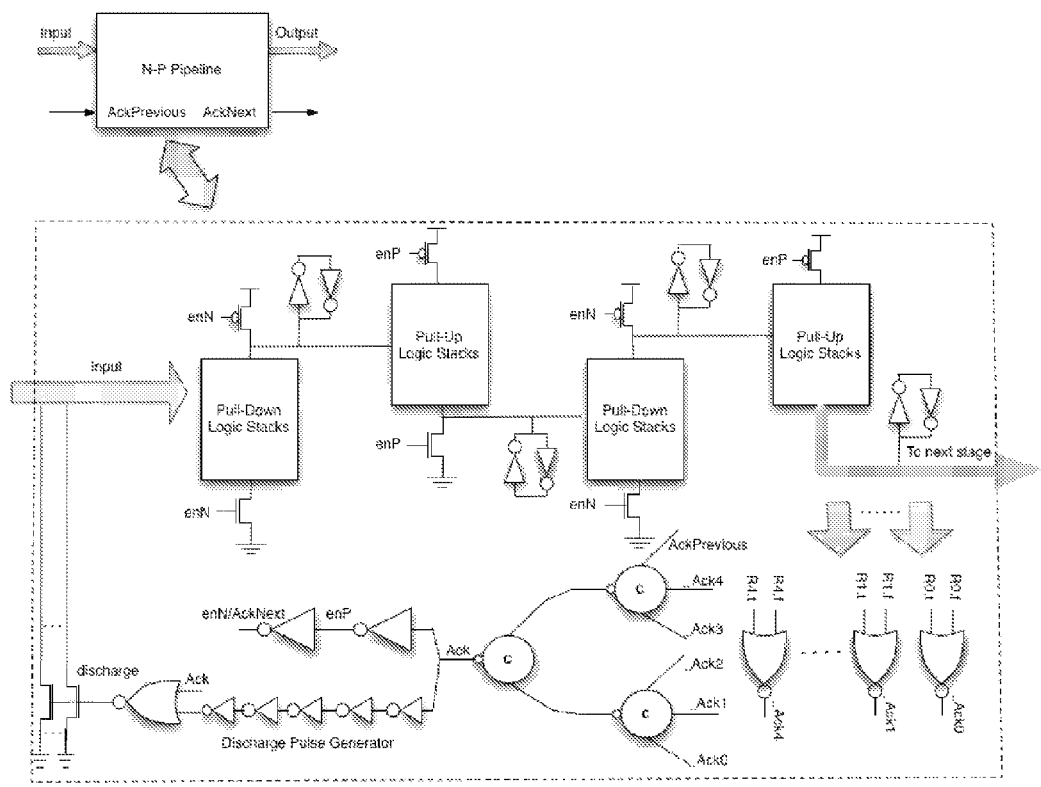
FIG. 4 N-P pipeline template.
Figure 6:
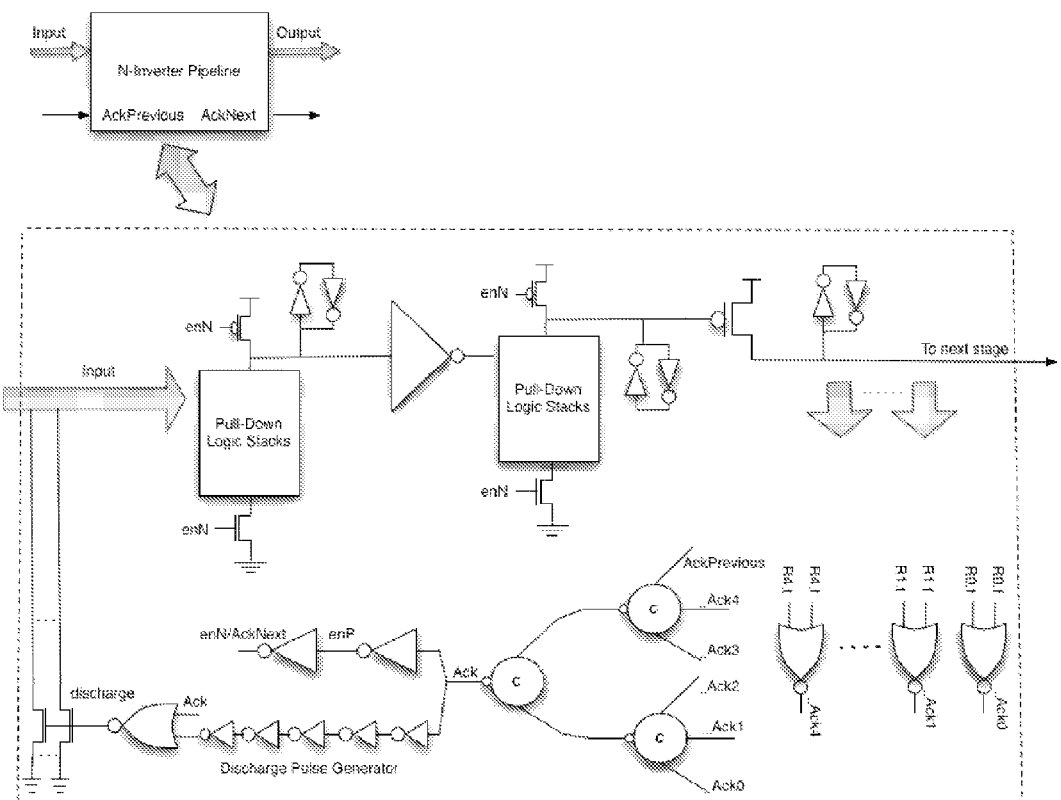
FIG. 6 N-Inverter pipeline template.

FIGS. 4 and 6 show two examples of asynchronous processing templates. These two examples are implementations of a device design for asynchronous processing without synchronization to a common clock. Such a device includes two or more asynchronous circuits that are connected to form an asynchronous processing pipeline. Each asynchronous circuit includes input conductive wires that receive and carry an input signal, an input acknowledgment conductive wire that receives an input acknowledgment signal from an upstream asynchronous circuit that produces the received input signal, an asynchronous processing module that processes the input signal to produce an output signal, a completion detection processing module that receives the input acknowledgment signal and the output signal and is operable to produce an output acknowledgment signal indicating completion of processing of the received input signal and generation of the output signal. The device also includes an output acknowledgment conductive wire that receives the output acknowledgment signal from the completion detection processing module and outputs the output acknowledgment signal, and output conductive wires that receive and carry the output signal generated by the asynchronous processing module.

In implementations, the number of the input conductive wires of an asynchronous circuit can be different from the number of the output conductive wires as long as the number of the input or output conductive wires match that of the next asynchronous circuit in the pipeline. In addition, each asynchronous circuit can include two or more processing pipelines. Hence, for example, in the above device, each asynchronous circuit can include second input conductive wires that receive and carry a second input signal, a second input acknowledgment conductive wire that receives a second input acknowledgment signal from another upstream asynchronous circuit that produces the received second input signal; a second asynchronous processing module that processes the second input signal to produce a second output signal; and second output conductive wires that receive and carry the second output signal generated by the second asynchronous processing module. This second asynchronous processing module can be operated independently from the asynchronous processing module. The example in FIG. 5 where the asynchronous circuit A includes two asynchronous circuits that processes the same input to produce two different outputs for two downstream asynchronous circuits B and C.

FIG. 4 shows an example of a semi detailed depiction of our first template with 5 arbitrary dual-rail outputs indicated by signals R0 to R4 based on single-track handshake protocol. This asynchronous template is named the template N-P pipeline since it computes logic using NMOS pull-down and PMOS pull-up stacks. Each NMOS and PMOS stage can comprise multiple logic stacks. However, for simplicity, multiple logic stacks and global reset signals are not illustrated in FIG. 4.

A PCeHB template has two logic stages per each pipeline, with the second logic stage comprising an inverter to drive the output rails. Hence, there is only one effective logic computation per pipeline block. In contrast, the N-P template has N arbitrary stages of actual logic computations. However, for ease of explanation and to keep cycle time within 18 transitions, we use N-P pipelines with four stages of logic. In the reset state, the NMOS logic nodes in the pipeline are precharged, whereas the PMOS logic nodes are pre-discharged. Each state-holding gate includes a staticizer, which comprises a keeper and a weak feedback inverter, to ensure that charge would not drift even if the pipeline were stalled in an arbitrary state. The staticizers, drawn as two cross-coupled inverters, for the intermediate as well as the final output nodes are shown in FIG. 4. When 1-of-N encoded input tokens arrive, logic is computed in the first stage by pulling down the precharged nodes. This is similar to how logic is computed in QDI templates. We limit the number of series transistors in an NMOS stack to a total of four. The second logic stage uses a stack of PMOS transistors to compute logic by pulling up the pre-discharged nodes. As the PMOS transistors have slower rise times, for throughput purposes we limit the number of series transistors in a PMOS stack to a total of three (including the enable). As the output nodes from the second stage pull up, the pull-down stacks in the third stage get activated and compute logic by pulling down their output nodes. Finally, the fourth stage computes logic by using its pull-up stack of PMOS transistors. The four cascaded stages of logic in our pipeline are similar to cascaded domino logic but without any static inverters in between dynamic logic stages.

There are no explicit validity detection gates for the arriving input tokens nor for any intermediate outputs that are being produced. AckPrevious (explained later in this section) signifies the validity of input tokens into the pipeline and alleviates the need to explicitly check for validity. For intermediate outputs produced within the template, validity is embedded in a pull-up or pull-down logic stack that uses the intermediate output to compute the following stage logic output. This could incur additional cost, depending on the function being implemented. However, for a logic stack inherently embedded with input validity, for example a stack that computes the sum of two inputs, there is zero validity detection overhead. The elimination of explicit validity detection gates for input tokens and intermediate output nodes leads to considerable power savings and minimization of handshake overhead. There is an explicit completion detection logic for all the outputs that eventually leave the pipeline, either at the end of the second stage or the fourth stage. The completion detection of the final outputs automatically signifies the validity of all intermediate outputs as well as that of all the initial input tokens into the N-P pipeline. The completion detection logic comprises a set of NOR gates and a c-element tree as shown in FIG. 4. Each of the c-element gate includes a staticizer in parallel. These staticizers are not shown for simplicity. The outputs from the NOR gates are combined using a c-element tree which de-asserts the Ack signal once all outputs are valid. This leads the discharge signal to go high, which initiates the reset of all input tokens. The discharge signal is only set for a short pulse duration. The de-asserted Ack signal also sets the enP signal to high which discharges all pull-up nodes in logic stage two. The enN signal is set low, which precharges all pull-down nodes in logic stages one and three. Since the neutrality of the internal nodes is not sensed, we introduce a timing assumption on their transition. The discharge of input tokens with a short pulse signal introduces another timing assumption. These two timing assumptions entail the following constraints:

The pull-down nodes must be fully precharged before enN goes high and pull-up nodes must be fully discharged before enP transitions low. This translates into a race condition of 1 pull-up/pull-down transition versus 9 gate transitions, the minimum transition count before both enN and enP flip when two N-P pipelines are in series.

Figure 5:
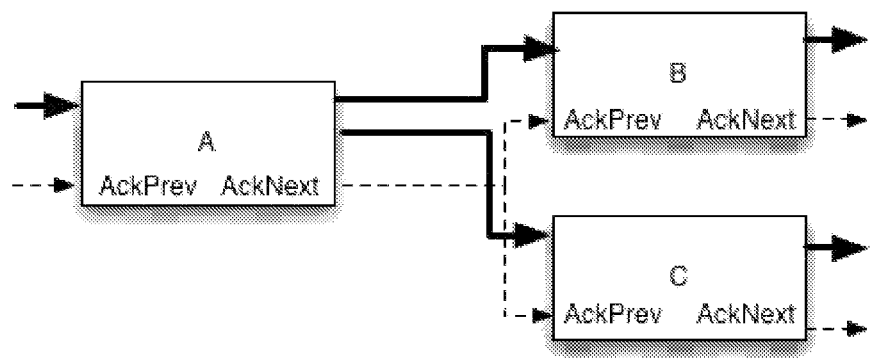
FIG. 5 Ack signals to ensure correctness.

All input tokens must be fully discharged within the short pulse discharge period. The pulse has a minimum period of 5 gate transitions. There are as many NMOS discharge transistors as there are input data rails. The robustness of our pipeline template is not compromised as these timing assumptions satisfy the minimum timing constraint of at least 5 gate transitions between any two relative path delay races. The discharge of any of the outputs before the validity of all other outputs has been acknowledged can permanently stall the pipeline. To analyze this effect, let us suppose we have three N-P pipelines A, B, and C as shown in FIG. 5. A produces two outputs, one of which goes to B and the other one to C. B uses the output from A to compute its output. Since B has computed its output, it can now discharge the input it received from A. If A's other output, which is headed for C, is not yet produced or acknowledged by the completion detection logic of A, then B's discharge of its input will make the completion detection logic of A unstable. To prevent this, we add the AckNext signal to our pipeline template. It is sent to all following pipeline stages that consume the outputs from the current N-P pipeline. This signal is referred to as AckPrevious in the destination pipeline as shown in FIG. 4. It prevents the discharge of the tokens coming from the sender stage before the validity of all outputs in the sender has been acknowledged. As mentioned earlier, AckPrevious also signifies the validity of input tokens into the pipeline, hence alleviating the need to check for input token validity in NMOS pull-down stacks. In the case where inputs come from more than one pipeline block, the AckPrevious signals from all corresponding pipeline blocks need to be added to the completion detection logic to ensure against any premature discharge of input data rails.

To determine the cycle time of the N-P pipeline of these teachings, let us assume two N-P pipelines in series with time (t) increments taken in terms of logic transitions.

At t=0, input tokens arrive at the first pipeline block.
At t=4, first pipeline block produces its output.
At t=7, Ack signal in the first block is de-asserted which signifies the validity of all output signals.
At t=8, second pipeline block produces its output.
At t=9, input tokens in the first pipeline block are discharged. Internal PMOS logic nodes are discharged.
At t=10, NMOS logic nodes in the first pipeline are precharged.
At t=13, output tokens from the first pipeline block are discharged by the second pipeline.
At t=16, Ack signal in the first block is asserted which signifies the reset of all output signals.
At t=18, enN is set and the pipeline is ready to accept new input tokens.

Hence, our N-P pipeline has a cycle time of 18 transitions. Stalls on inputs and outputs do not impact correct operation. The template waits in its present state if inputs arrive at different times. This holds true for outputs being computed at different times as well. The relative path delay assumption has a root, Ack, which only changes after all inputs have arrived and all outputs have been computed. As a result, correct operation is not a function of arrival time of signals, which makes the N-P template quite robust.

We could invert the senses of the inputs and outputs by changing the order of the logic stacks within N-P pipeline. With inverted inputs, the first stage comprises PMOS logic stacks and the final logic stage comprises NMOS logic stacks with the outputs produced in inverted sense. This could improve the drive strength of the output signals especially in the case of high fan-out.

Our second pipeline template replaces the PMOS pull-up logic stacks in stage 2 with an inverter, hence the name N-Inverter template, and includes only a single pull-up PMOS transistor in stage 4 as shown in FIG. 6. As PMOS logic stacks have slower rise times and relatively weak drive strength, the N-P template cycle time may incur a performance hit. The N-Inverter template addresses this by using inverters with faster switching time and strong drive strength. It also results in better noise margins as discussed in detail in Section 5. However, these improvements come at the cost of reduced logic density as stage 2 and 4 no longer perform any effective logic computation. Despite these alterations, the N-Inverter and N-P templates use exactly the same timing assumptions. The completion detection and handshake circuitry is also identical.

Figure 7:
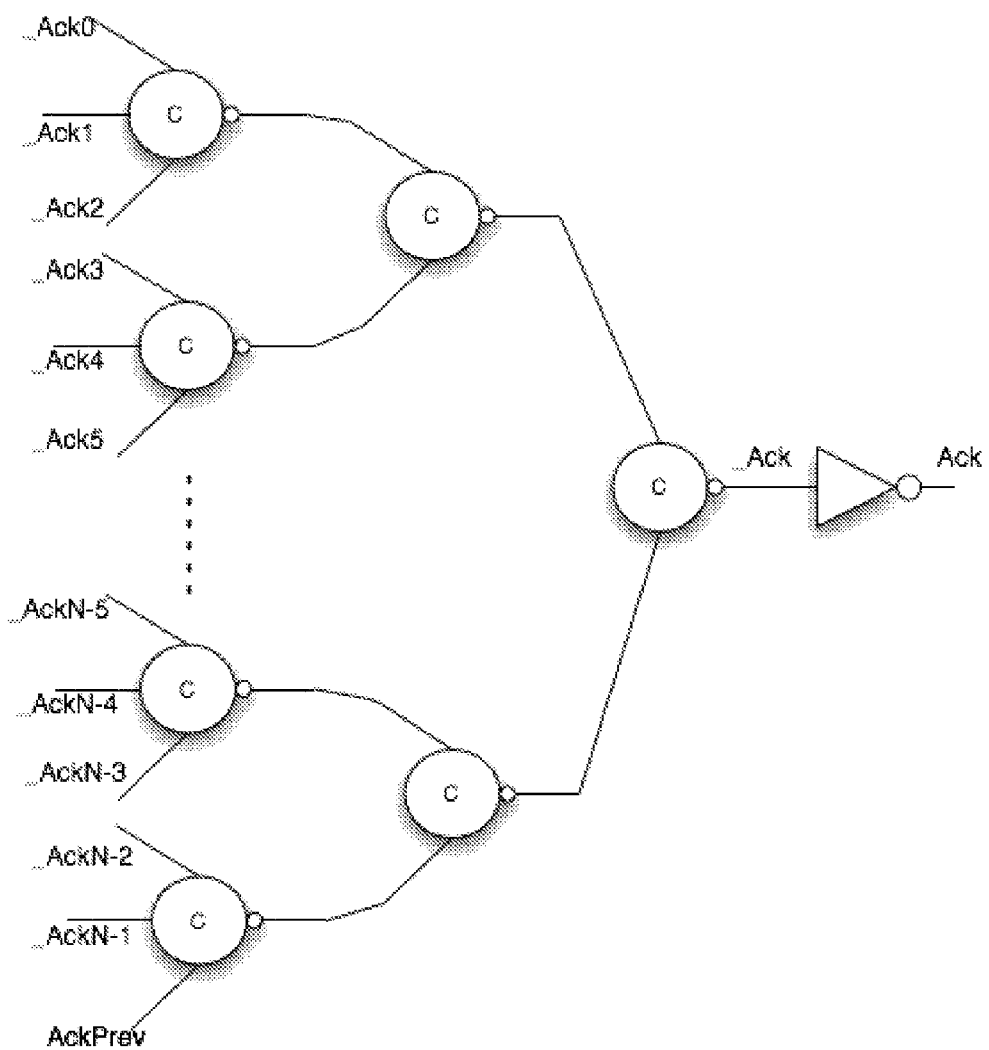
FIG. 7 Multi-stage c-element tree completion detection logic for large number of outputs.
Figure 8:
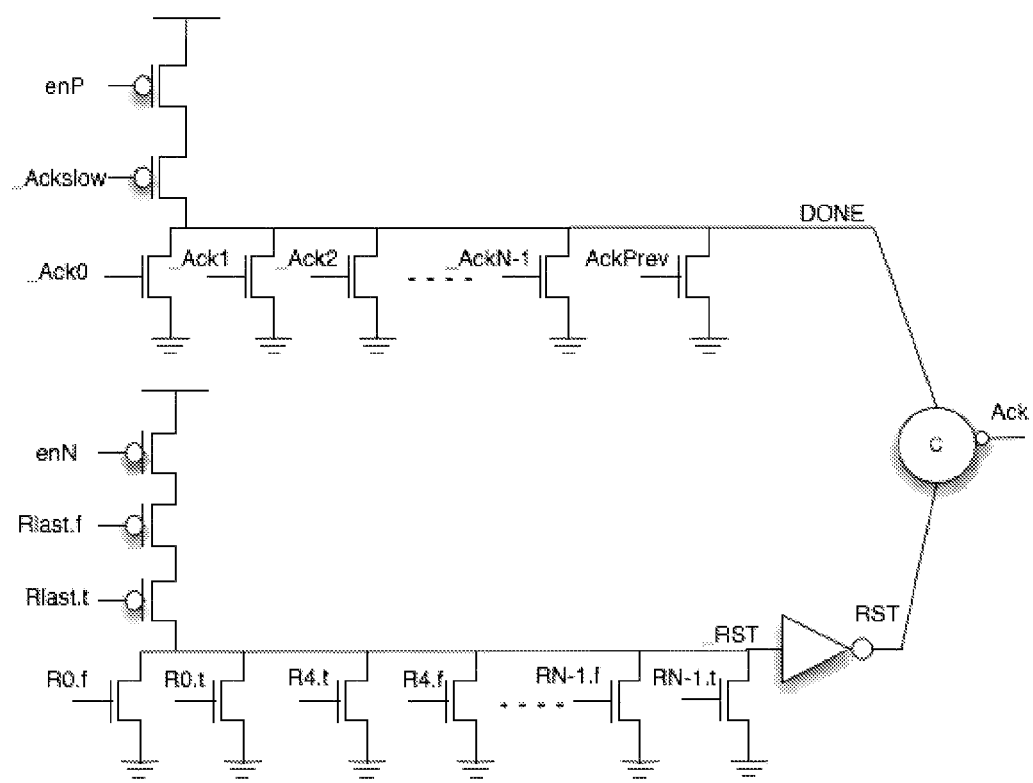
FIG. 8 Completion detection logic for large number of outputs.

Since N-P and N-Inverter pipeline templates can pack significant logic in a single pipeline block, there may be cases where a pipeline block has quite a large number of outputs. To detect the validity of these large number of outputs, we may have to expand the c-element validity tree by a couple of extra stages as shown in FIG. 7. As a result of these two extra stages in the completion detection validity tree, the cycle time of N-P and N-Inverter templates is no longer 18 transitions. There are four extra transitions, two each for the validity and neutrality detection of the output signals, which increases the cycle time to 22 transitions. Since our goal was to keep the cycle time within 18 transitions, we explored a number of other completion detection circuits [Schuster and Cook 2003] [Cheng 1998]. To reduce the cycle time back to 18 transitions, we use wide NOR gates based completion detection circuitry as proposed in [Cheng 1998], but with a couple of optimizations to make the circuitry feasible for our pipeline templates. These optimizations include the use of only one out-put from the set of outputs destined for the same next pipeline block for neutrality detection and the addition of enP and enN transistors in the pull-up stacks of DONE and RST circuits as seen in FIG. 8. These optimizations and their benefits are outlined in detail towards the end of this section.

The Ack signals are generated using static NOR gates as previously. The validity of the outputs is signaled by the setting of Done. To ensure that the Done signal is only set once all Acks have gone low, the pull-up path resistance of the Done circuit is set to be at least 4 times as big the pull-down path resistance when only one pull-down transistor is conducting. To prevent a direct path between VDD and GND, the Ack from one of the latest (slowest) outputs is used in the pull-up stack. The RST signal is used to sense the reset of all outputs. The various R.t and R.f signals correspond to the actual dual-rail outputs being produced. The latest (slowest) signal to reset is put in the pull-up stack. The pull-up path resistance of the RST circuit is set to ensure that it only goes high once all pull-down transistors in the RST circuit have turned off i.e. all output signals have reset. The RST circuit has two pulldown transistors for each dual-rail output and four pull-down transistors for each 1-of-4 output. As the number of outputs increase, the RST rise time suffers significantly. A close inspection of our pipeline templates made us realize that for outputs destined for the same pipeline block, we only need to check for the reset of one of the outputs and not all because they use the same discharge pulse. Let us assume the dual-rail outputs R0 to R3 are all headed for the same pipeline block. We minimize the RST circuit by only using pull-down transistors corresponding to R0 output. The transistors corresponding to R1, R2, and R3 dual-rail outputs are eliminated as shown in FIG. 8.

The addition of enP and enN transistors in the pull-up stacks of DONE and RST circuits was another optimization we introduced. The enP signal cuts off the pull-up path in the DONE circuit while the pipeline is waiting for the outputs to be reset. This prevents the occurrence of a direct path between VDD and GND if any of the Acks other than Ackslow goes high first. Similarly, the introduction of enN in the pull-up stack of RST cuts off the direct path between VDD and GND during the evaluation phase.

The above examples of asynchronous processing templates provide the structure for various asynchronous processing operation methods. For example, one example of an asynchronous processing can be implemented to include connecting asynchronous circuits in series to form an asynchronous processing pipeline to allow one asynchronous circuit to communicate with next adjacent asynchronous circuit to communicate while permitting each asynchronous circuit to perform signal processing, without a common clock. This method further includes operating two adjacently connected asynchronous circuits in the asynchronous processing pipeline to communicate by directing signals from one of the two adjacently connected asynchronous circuits that is upstream relative to the other asynchronous circuit without having an acknowledgment feedback from the downstream asynchronous circuit to the upstream asynchronous circuit; operating each asynchronous circuit to encode an input or output signal by using a plurality of conductive wires to carry the input or output signal and by having only a single wire of the plurality of conductive wires asserted at a time; and operating each asynchronous circuit to use a single conductive wire to send an acknowledgment signal to the downstream asynchronous circuit. This single conductive wire is additional to the conductive wires for carrying the output signal from the upstream asynchronous circuit to the downstream asynchronous circuit.

Figure 9:
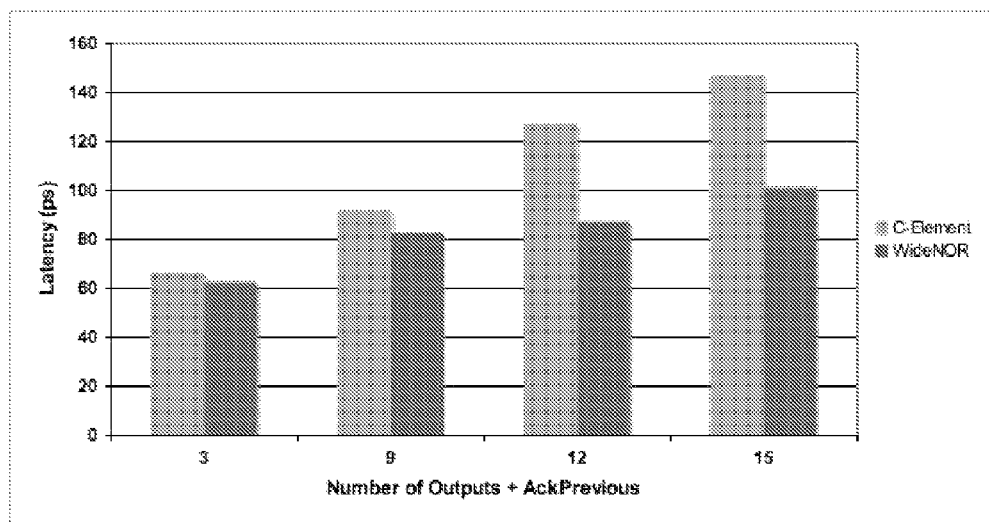
FIG. 9 Latency comparison of completion detection schemes.

Based on the above exemplary designs, SPICE level simulations were conducted with estimated wire loads for each node to quantify the trade-offs between the two completion detection schemes. In these simulations, it is assumed that each output goes to a separate pipeline block and, hence, the discharge of each signal is checked. The wide NOR completion detection circuitry results in lower latency relative to multi-stage c-element tree detection completion scheme across a wide range of outputs as shown in FIG. 9. The latency difference increases as the number of outputs increases since c-element completion may require multiple extra stages. For 15 output signals, the wide NOR completion results in 30% less latency.

Figure 10:
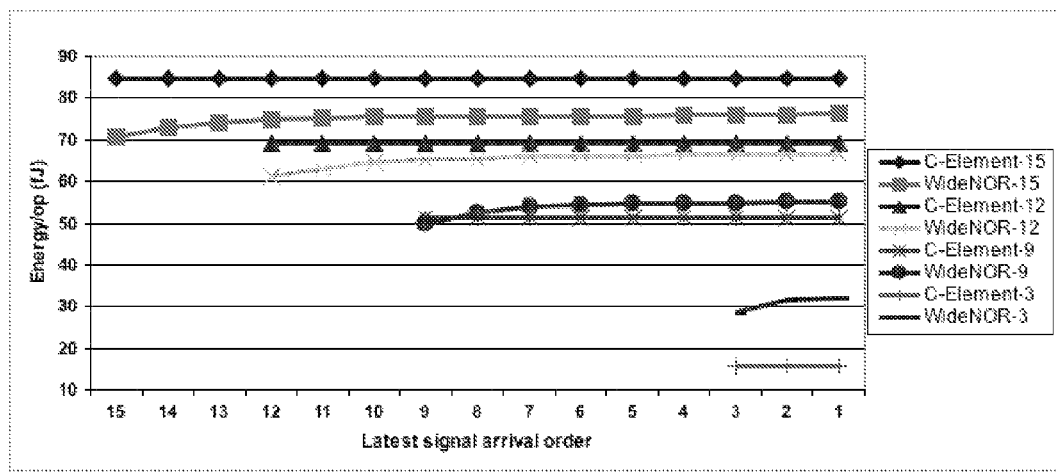
FIG. 10 Completion detection energy consumption for different arrival order of chosen signal.

In terms of energy consumption, the choice of a completion detection scheme depends not only on the number of outputs but also on the arrival order and the delay of the chosen latest signal as shown in FIG. 10. The x-axis corresponds to the arrival order of the chosen latest signal. For example, the data point corresponding to the arrival order of 9 means that our chosen latest output was the ninth output to be set or reset. All of the remaining signals arrived after an arbitrary 2-FO4 delay. This corresponds to a period of direct path between VDD and GND for wide NOR based completion detection scheme. The c-element based completion detection scheme consumes the same energy irrespective of the arrival order. It is also more energy-efficient when the number of outputs is 9 or less. However, with a greater number of outputs as may be required for some N-P and N-Inverter pipeline templates, the wide NOR based completion detection scheme consumes significantly less energy. Another noteworthy observation from FIG. 10 is that the effect of arrival order on energy consumption is only profound when the latest signal is one of the last few signals.

Figure 11:
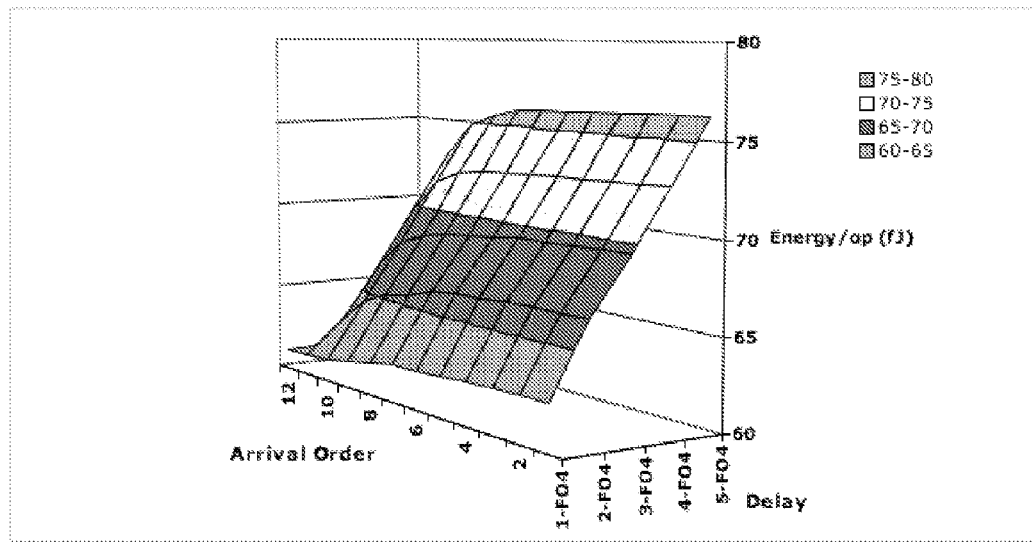
FIG. 11 C-Element vs WideNOR for 12-outputs with varying delay of latest signal.
Figure 12:
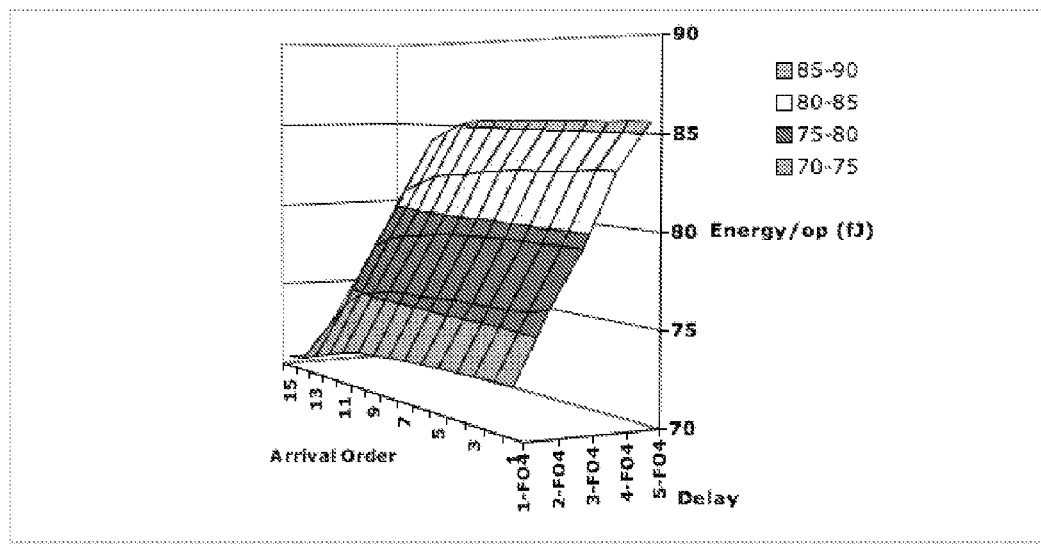
FIG. 12 C-Element vs WideNOR for 15-outputs with varying delay of latest signal.

The longevity of the period of direct path between VDD and GND, when the chosen latest signal is the not the last one, may lead to significant energy consumption for wide NOR based completion detection scheme. To explore this effect, we simulated wide NOR completion circuits for 12 and 15 outputs by varying the delay of late arriving signals as seen in FIG. 11 and FIG. 12. These plots also include the results for corresponding c-element tree based completion detection schemes. For 12 outputs, unless any output arrives 3 or more FO4 delays after the chosen latest signal, the wide NOR completion consumes less energy compared to the c-element based completion scheme, irrespective of the arrival order of the latest signal. For 15 outputs, the margin increases to 5 or more FO4 gate delays for the wide NOR completion to consume more energy than the corresponding c-element based completion detection scheme.

Figure 13:
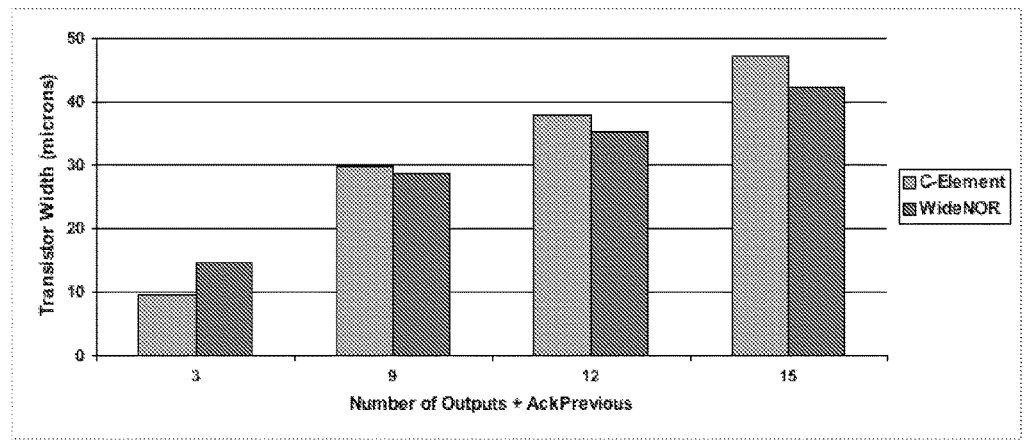
FIG. 13 C-Element vs WideNOR: total transistor width comparison.

In terms of transistor area, the wideNOR completion detection circuit becomes more efficient as the number of outputs increase as seen in FIG. 13. The choice of a particular completion detection circuit is therefore a design choice, which may depend on a number of factors: the number of outputs for a pipeline stage, latency and throughput targets, power budget, area constraints, and the delay variability of chosen latest output.

Figure 14:
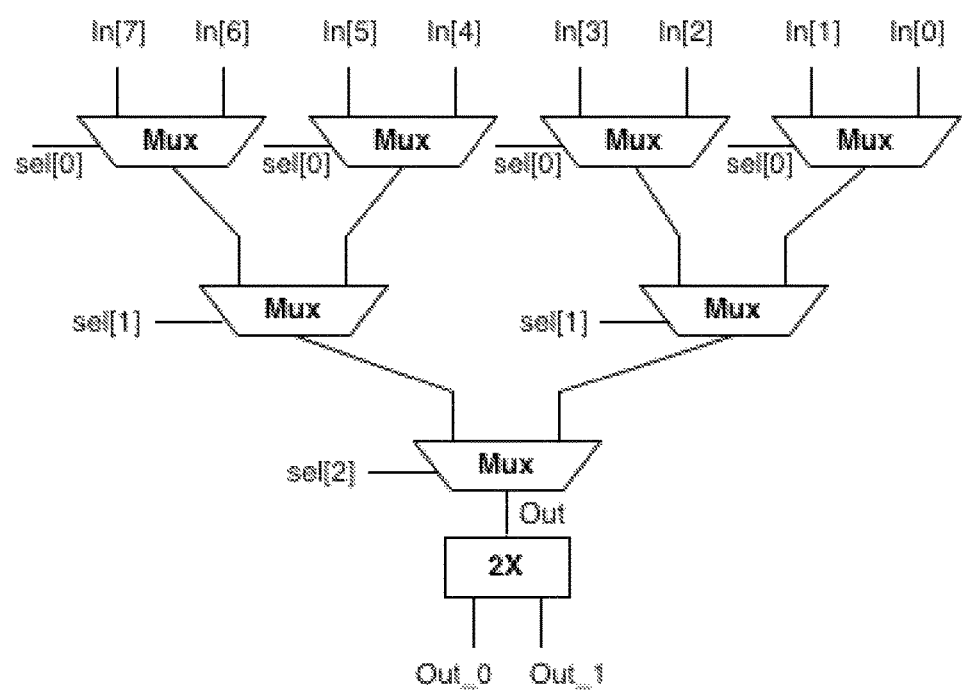
Figure 15:
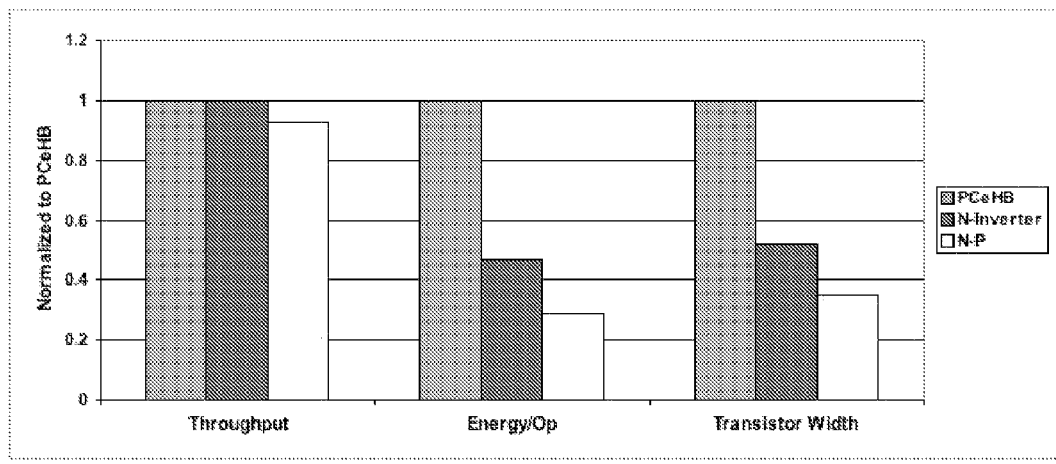

Throughput, energy, and area are critical design considerations for a circuit designer. We choose an 8-to-1 multiplexor design, which produces multiple copies of the output as shown in FIG. 14, to highlight some of these trade-offs in our templates. PCeHB, N-P, and N-Inverter pipelined versions of the chosen circuit were implemented. Highest precision SPICE simulations were conducted in 65 nm bulk CMOS process with estimated wire loads for each node.

Although, all three templates have a cycle time of 18 transitions, the N-P implementation results in an 8.5% lower throughput. The N-P implementation is slower because it employs some logic computations in PMOS stacks, which have slower slew rates and weaker drive strength than NMOS stacks. In a PCeHB implementation, each 2-to-1 multiplexor represents a separate pipeline stage with each stage incurring a significant handshake overhead as seen earlier in Table I. There is a separate pipeline block for copy logic as well. Whereas, in N-P and N-Inverter implementations, the full 8-to-1 multiplexor circuit including copy logic can be packed completely in one and two pipeline blocks respectively. The effect of this logic compaction on energy efficiency and total transistor width is quite profound. Our N-Inverter implementation, operating at the same throughput as a PCeHB design, consumed 52.6% less energy per operation while using 48% less transistor width. With N-P pipeline, the energy and transistor width savings shoot up to 71.2% and 65% respectively, albeit at an 8.5% throughput penalty.

Figure 16:
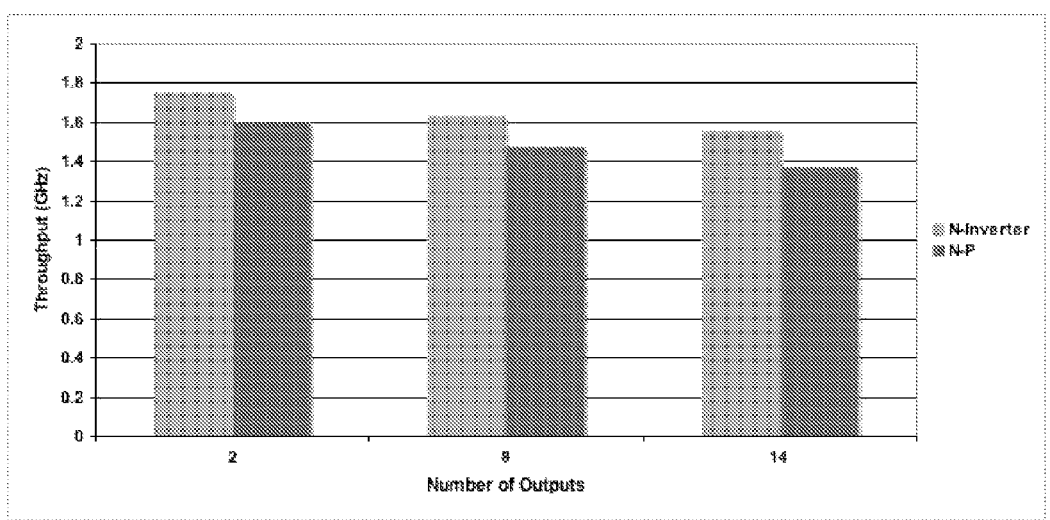
FIG. 16 Throughput dependency on the number of outputs.

The N-P and N-Inverter templates of these teachings enable us to pack more logic computations within a single pipeline stage while maintaining a very high throughput. This flexibility is not available in standard PCeHB designs, which are composed of pipeline stages with only one effective logic computation in a single stage. More logic per a single stage in our templates creates a likelihood of a large number of outputs per pipeline, which may adversely affect overall throughput as shown in FIG. 16. The dependency of absolute throughput on the number of outputs highlights an important design trade-off. With more outputs, although the number of transitions remain the same with the use of a wide NOR completion detection logic, each of these transitions incur a higher latency as shown earlier in FIG. 9. The results would be even worse if a c-element based completion logic was used as it would incur 4 extra transitions per each cycle.

Figure 17:
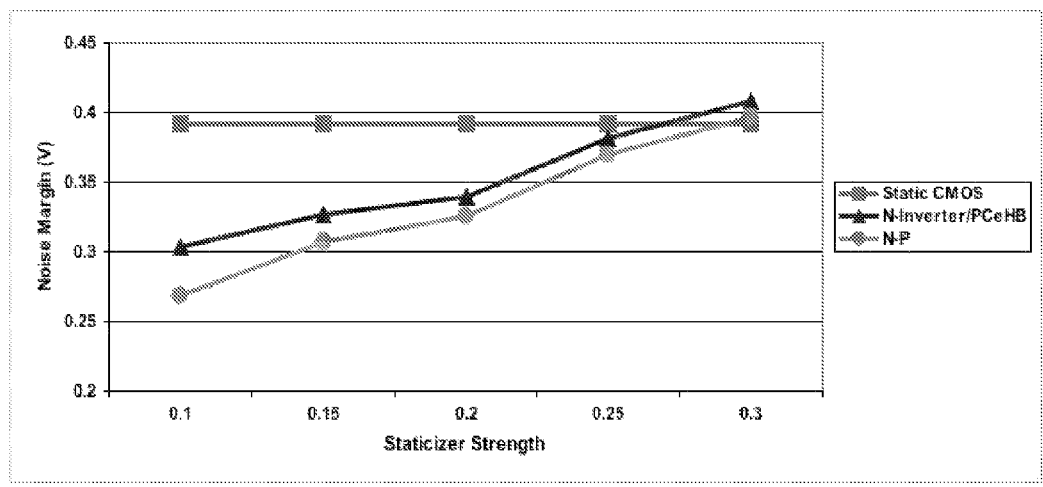
FIG. 17 Noise margin analysis.

Noise feed through is one of the major concerns when it comes to the use of dynamic gates. Since our pipeline templates use cascaded dynamic gates for logic computations, we carried out comprehensive noise margin analysis of our circuits. Dynamic gates from each pipeline template were simulated across all process corners, typical-typical (TT), slow-fast (SF), fast-slow (FS), slow-slow (SS), and fast-fast (FF), in a 65 nm bulk CMOS technology with highest-precision SPICE configuration at 1V nominal VDD and 85_C operating temperature. Since SPICE simulations do not account for wire capacitances, we included additional wire load in the SPICE file for every gate in the circuit. For each pipeline template, the lowest value of noise margin amongst all process corners was chosen. For noise feedthrough analysis of N-P template, we analyzed a full-adder NMOS logic stack followed by a two-input AND gate in a PMOS pull-up stack. The noise margin, as defined in [Weste and Harris 2004], of this cascaded N-P configuration is the difference in magnitude between the minimum low input voltage recognized by NMOS logic stack on one of the inputs at unity gain point and maximum low output voltage of the driving PMOS pull-up stack. For N-Inverter and PCeHB templates, we analyzed a full-adder NMOS logic stack followed by a static CMOS inverter, with noise margin defined as the difference in magnitude between the minimum low input voltage recognized by NMOS logic stack on one of the inputs and maximum low output voltage of the driving output inverter. The results are shown in FIG. 17 which also shows the noise margin of a two-input static CMOS NOR gate for comparison.

Figure 18:
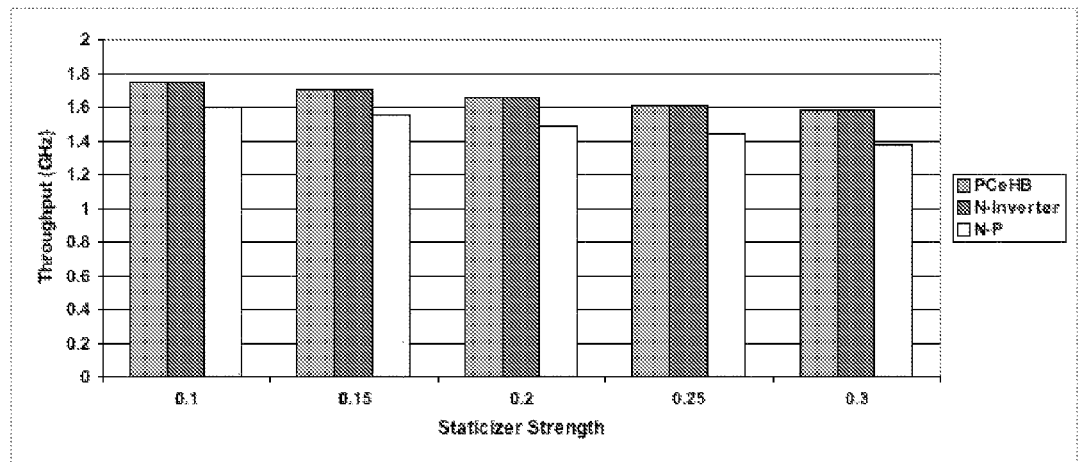
FIG. 18 Effect of staticizer strength on pipeline throughput.
Figure 19:
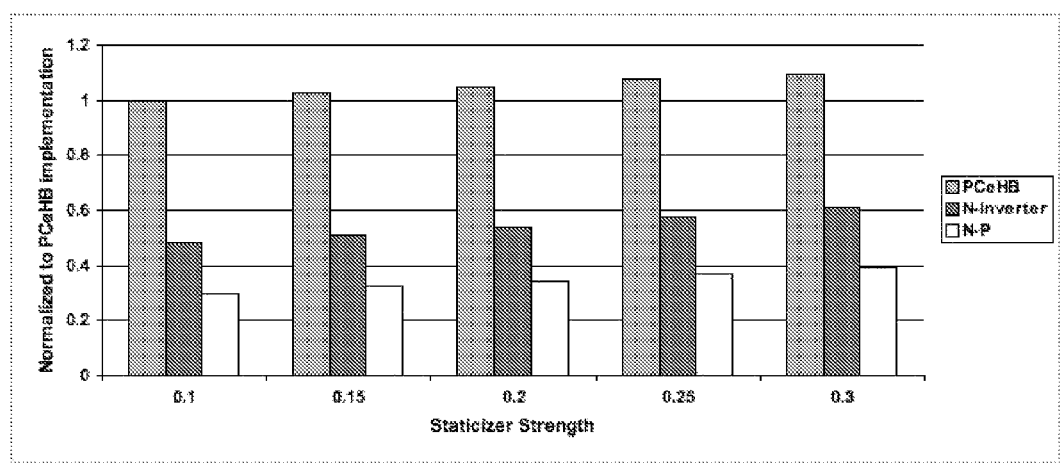
FIG. 19 Effect of staticizer strength on energy per operation.

The N-P template has the lowest noise immunity. However, the noise margin can be significantly improved by increasing the relative drive strength of the staticizers to dynamic logic stacks. But this improvement comes at the cost of throughput degradation and a slight increase in energy per operation as shown in FIG. 18 and FIG. 19, respectively. The energy per operation results are normalized to a PCeHB implementation energy per operation at a staticizer strength of 0.1. As seen from these results, the choice of an exact strength value for a staticizer represents a design trade-off, which circuit application.

The N-P and N-Inverter pipeline templates include multiple timing assumptions, the breach of which could impact correct operation or stall the pipeline. In Section 4, we discussed the timing margins necessary to ensure correctness, but these timings margins were given in terms of gate transitions. To ensure sufficient robustness of our templates, we analyzed the exact timing constraints of full transistor-level implementations of our pipelines in a 65 nm bulk CMOS technology with highest precision SPICE configuration at 1V nominal VDD, 85_C operating temperature, and estimated wire loads for each gate. The timing constraint of 9 gate transitions for precharge and discharge of internal nodes translated into 14.8 FO4 and 12.2 FO4 delays for N-P and N-Inverter pipelines respectively, whereas the worst case transition corresponding to precharge or discharge of an internal node took no longer than 2.67 FO4 delays. This yields a very safe timing margin of over 12 FO4 and 9.5 FO4 delays for N-P and N-Inverter pipelines respectively.

The second timing assumption in the N-P and N-Inverter pipelines pertains to the full discharge of all input tokens within the short pulse discharge period. The 5 transition discharge pulse translates into 5 FO4 delays for both N-P and N-Inverter templates. The discharge pulse timing margin is a function of input load, which in turn is a function of input gate and wire capacitances. Since we envision our templates to be used for large chunks of local computation and not for global communication, we found the short pulse period sufficient for full input token discharge including the added wire capacitance for each node, which corresponds to 12.5 m wire length. In the worst case, an input token took no longer than 2.5 FO4 delays to fully discharge, which yields a timing margin of 2.5 FO4s. Since the discharge pulse period is not on pipeline critical path for both forward latency and throughput, the timing margin could be improved by adding two extra inverters to the pulse generator inverter chain without affecting performance. With these two extra inverters, the timing safety cushion increases from 2.5 FO4 to 4.5 FO4 delay, which makes the templates significantly more robust.

Figure 20:
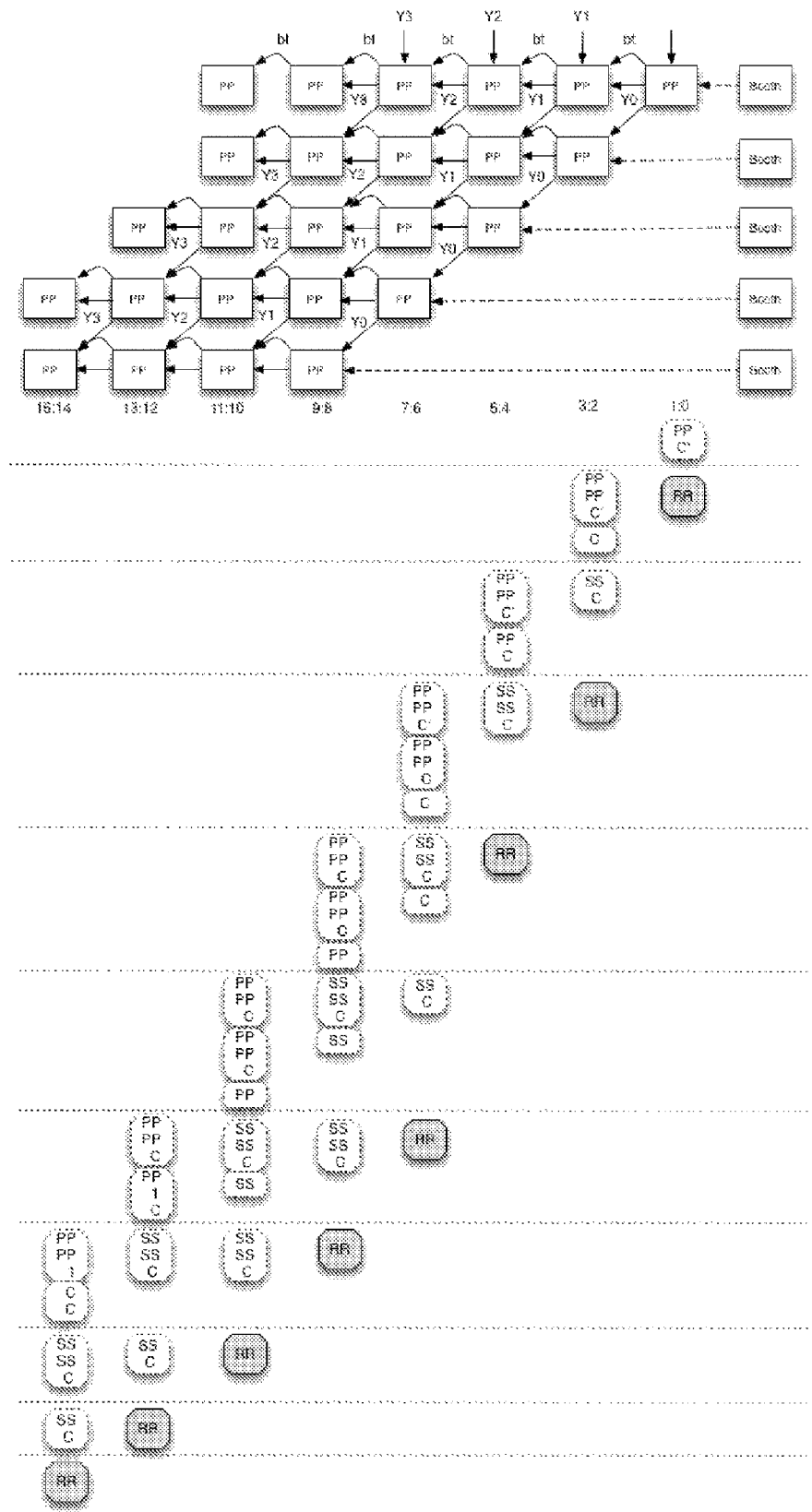

High performance multiplier circuits are an essential part of modern microprocessors [Schmookler et al. 1999] [Trong et al. 2007] and digital signal processors [Tian et al. 2002]. To achieve high throughput and low latency, most high performance chips use some form of booth encoded array multiplication hardware [Booth 1951]. The array multiplier architecture requires a large number of tokens to be in flight at the same time. Each multiplication operation produces a number of partial products which are then added together to produce the final product. In terms of its usefulness to a wide-range of applications and significant circuit complexity, a high throughput array multiplier is a good candidate to effectively highlight the trade-offs between PCeHB and our pipeline templates. In this case study, we focus on improving energy efficiency by packing considerable logic within each pipeline stage, even at the cost of incurring throughput degradation of up to 25% compared to PCeHB style pipelines. We implemented an 8×8-bit radix-4 booth-encoded array multiplier (at the transistor level) using PCeHB pipelines to act as our baseline. FIG. 20 shows the top-level specification of our 8×8-bit multiplier. The top part of FIG. 20 shows the partial product generation for the array multiplier. Each of the Y inputs is in a radix-4 format. The multiplicand bits are used to generate the booth control signals for each partial product row. Since a PCeHB pipeline can only compute a small amount of logic, each of the rectangular boxes labeled PP represents a separate pipeline stage. The booth control signals and multiplier input bits are sent from one pipeline stage to another, while each pipeline stage produces a two bit partial product. The second half of FIG. 20 shows the order in which the partial products are produced and summed up. The horizontal dotted lines separate different time periods. Each of the dotted polygons represent a separate PCeHB pipeline stage. The entries inside each polygon represent the inputs which are added together to produce the sum and carry outputs for the next pipeline stage. PP stands for two-bit partial product entry, C' corresponds to sign bit for each partial product row, SS stands for two-bit sum output from a previous stage, and C stands for a single-bit carry output from a previous stage sum computation. The final product bits are generated in a bit-skewed fashion, indicated by the symbol RR. Hence, we need to add slack-matching buffers on the outputs as well as some of the inputs to optimize the multiplier throughput [Cummings et al. 1994]. For simplicity, we do not show these slack-matching buffers in FIG. 20. Our baseline multiplier is highly pipelined but contains very little logic in each pipeline stage. While this helps to achieve a very high throughput of 18 transitions per cycle, there is a large handshake overhead per each pipeline stage.

Figure 21:
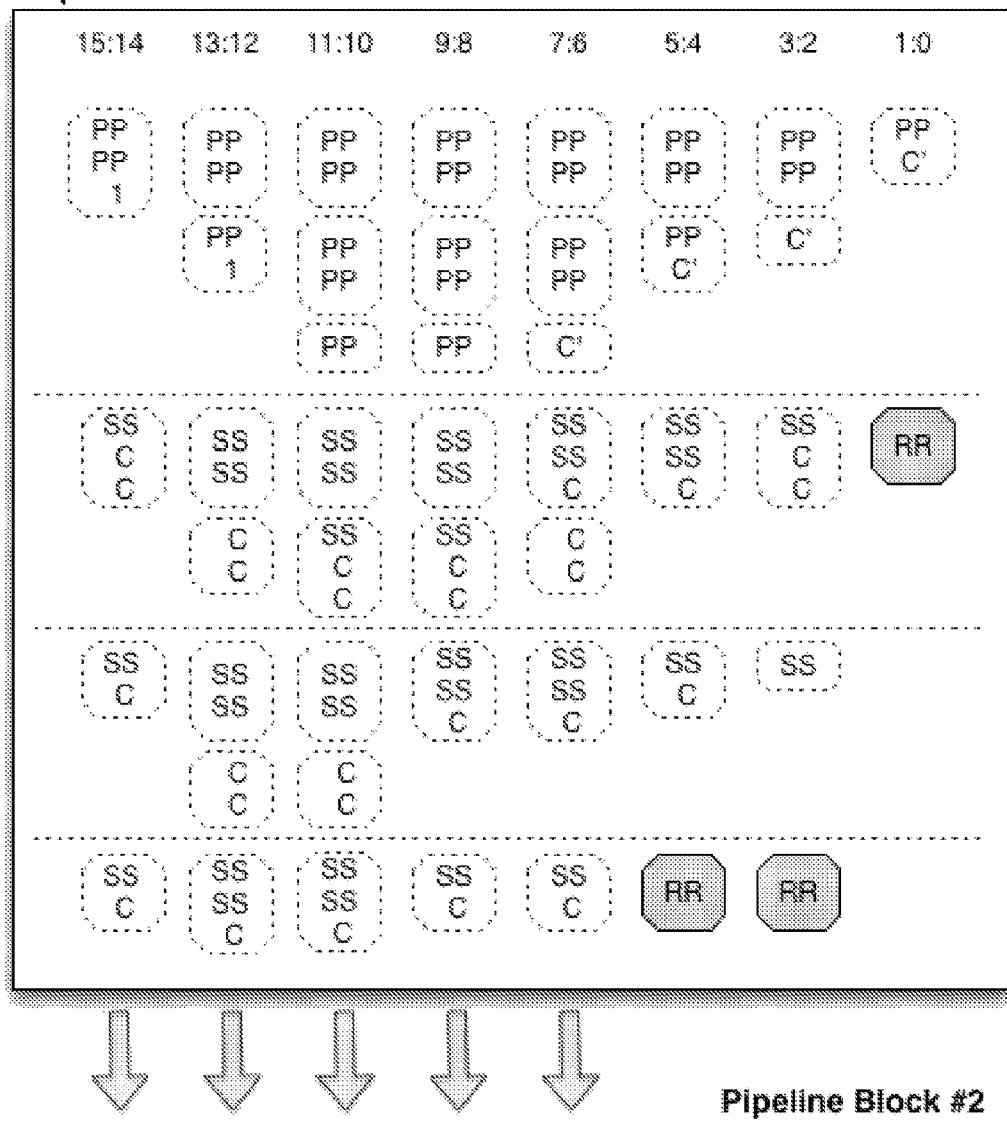
Figure 21:
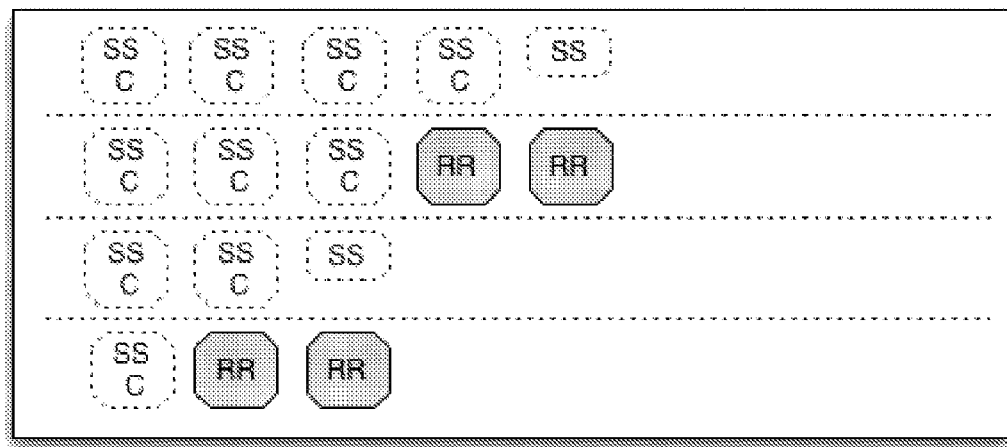

To quantify the energy efficiency and other characteristics of our lowhandshake pipeline templates, we implemented similar full transistor level 8×8-bit radix-4 booth-encoded array multipliers using N-P and N-Inverter pipeline templates. FIG. 21 shows an overview of N-P pipelines and their logic stacks for the 8×8-bit array multiplier. Both N-P pipelines have four stages of logic. The first stage of the first pipeline generates all partial product entries. This is clearly a big power saving, as booth control signals and multiplier inputs need to be generated only once and not for each separate pipeline block as in the PCeHB implementation. Each dotted polygon represents a logic stack and not a separate pipeline stage, which leads to very high logic density in each pipeline block. Each RR, SS, and C signal represents a single output channel, which translates into 14 outputs for the first N-P pipeline block and 4 outputs for the second N-P block. The N-Inverter pipeline implementation, not shown due to space constraints, requires twice as many pipeline stages as N-P implementation since no effective logic computation is performed in its PMOS pull-up stacks. However, the rest of the design is similar to N-P pipeline implementation with considerable logic within each pipeline stage.

In contrast to the large number of fine-grain pipeline blocks in the PCeHB implementation, we only need two N-P and four N-Inverter pipeline stages to implement the bulk of 8×8-bit multiplication logic. The inputs to the first pipeline for both N-P and N-Inverter implementations are four radix-4 multiplier bit entries and booth control signals for all rows, which are generated separately using PCeHB style pipelines. Since PCeHB pipelines follow a four phase handshake protocol, we use four phase to single-track conversion templates similar to those in [Ferretti and Beerel 2002] but with a few modifications. Due to space constraints, we do not discuss the conversion templates. For pipeline blocks with more than nine outputs, we use wide NOR completion detection scheme. For outputs destined for the same pipeline block, we only track the neutrality of one of the outputs going to the second pipeline. This optimization greatly reduces the complexity of RST circuitry, reduces power consumption, and increases the throughput by up to 6.3% for our pipeline templates. To highlight the seamless integration of N-P and N-Inverter pipelines within any four phase handshake environment, we convert the resultant product outputs into four phase 1-of-4 encoding.

Figure 22:
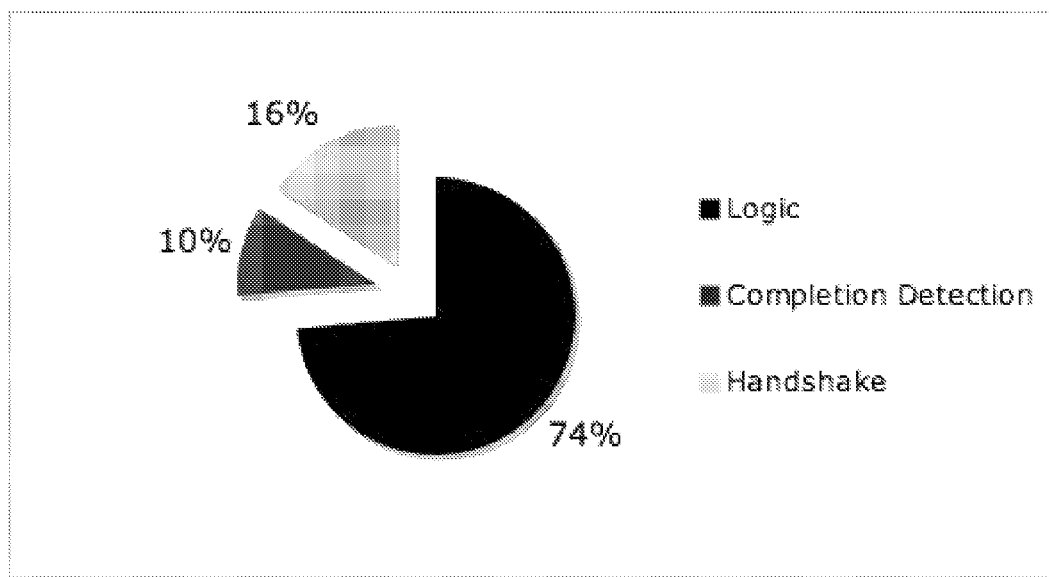
FIG. 22 Power consumption breakdown of N-P and N-Inverter pipelines.

The transistors in our baseline PCeHB multiplier implementation and our NP and N-Inverter pipeline implementations were sized using standard transistor sizing techniques [Weste and Harris 2004]. The slow and power-consuming state-holding completion-elements were restricted to a maximum of three inputs at a time. Keepers and weak feedback inverters were added for each state-holding gate to ensure that charge would not drift even if the pipeline were stalled in an arbitrary state. Since HSIM/HSPICE simulations do not account for wire capacitances, we included additional wire load in the SPICE file for every gate in the circuit. Based on prior experience with fabricated chips and post-layout simulation, we have found that our wire load estimates are conservative, and predicted energy and delay numbers are typically 10% higher than those from post-layout simulations. Our simulations use a 65 nm bulk CMOS process at the typical-typical (TT) corner. Test vectors are injected into the SPICE simulation using a combined VCS/HSIM simulation, with Verilog models that implement the asynchronous handshake in the test environment. All simulations were carried out at the highest-precision setting. FIG. 22 shows the power-consumption breakdown of our pipeline templates. In contrast to the PCeHB pipelines, which consume over 69% power in handshake overheads, the handshake and completion detection logic accounts for only 26% of the total power in our pipelines. The elimination of validity and neutrality detection logic for a large number of intermediate nodes in each pipeline is the main reason for the reduction of handshake related overheads. To fully quantify and evaluate our pipeline templates, we simulated all three 8×8-bit array multiplier implementations across a wide range of voltages. All experimental results presented in this section include the explicit overhead of conversion templates. These templates convert input tokens from four phase protocol to single-track protocol and the outputs from single-track protocol back to four-phase protocol.

Figure 23:
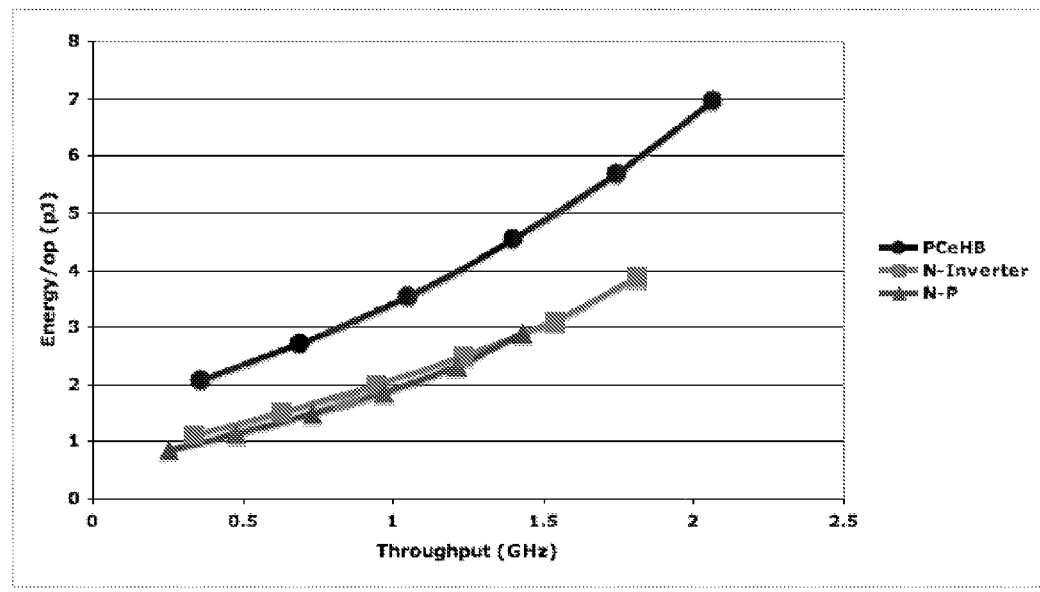

The throughput and energy consumption results for all three pipeline implementations with data points corresponding to 0.6V to 1.1V at 0.1V intervals plotted from left to right in FIG. 23. As stated earlier, the N-Inverter and N-P implementations were designed from energy efficiency perspective while allowing throughput degradation of up to 25% compared to PCeHB design. To minimize handshake circuitry, each N-Inverter and N-P pipeline block was packed with considerable logic computations and produced a large number of outputs, which reduced overall throughput. Hence, in terms of throughput, the PCeHB pipeline implementation yields the best results across all voltages. But this performance improvement comes at the cost of 45.4% and 59.5% higher energy per operation compared to the N-Inverter and N-P pipeline implementations respectively. Another key observation from FIG. 23 is that for any single throughput target, be it in low throughput range such as 400-500 MHz or in high throughput range such as 1.3-1.5 GHz, our templates consume far less energy per operation than the PCeHB implementation.

Figure 24:
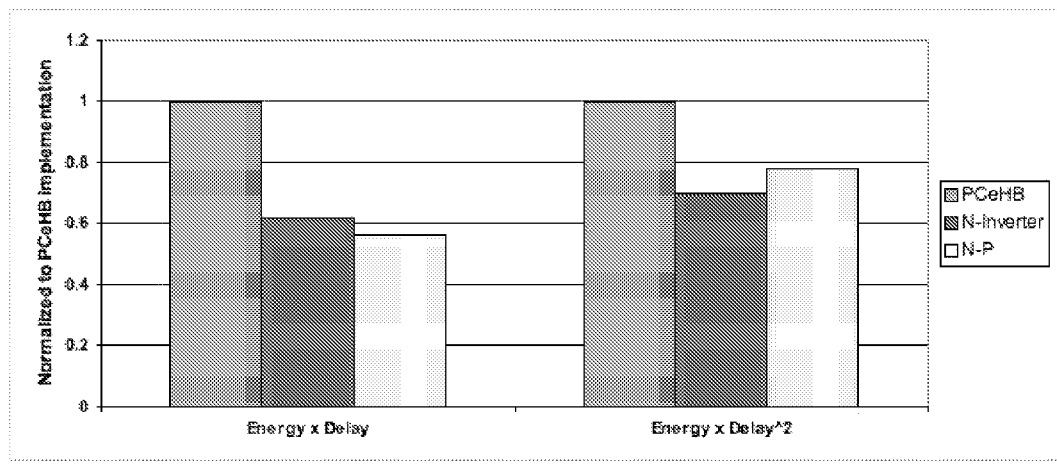

The fact that our pipelines worked across a vast voltage range without requiring any transistor re-sizing highlights the robustness of our templates. The experimental results include the power consumed in templates that are required to convert the inputs from four phase protocol to single-track protocol and the outputs from single-track protocol to four phase protocol. The energy savings are largely due to:
- The massive reduction in the handshake circuitry because of the elimination of validity and neutrality detection gates for all internal nodes.
- The sharing of inputs and intermediate outputs within a same pipeline block. In a PCeHB implementation, the inputs and outputs are copied from one stage to another and are subjected to separate validity and neutrality detection checks within each pipeline block.
- The use of a more energy-efficient completion detection scheme. To consider performance and energy together, we use two metrics: energy-delay product and energy-delay2 product as shown in FIG. 24. The results are normalized to the PCeHB implementation. The N-Inverter and N-P pipelines reduce the energydelay product by 38.5% and 44% respectively. For energy-delay2 product, N-Inverter implementation yields a 30.3% reduction and N-P pipelines result in 22.2% reduction when compared to the PCeHB implementation.

The N-Inverter and N-P implementations reduce the overall multiplier latency by 20.2% and 18.7% respectively as shown in Table II. These two pipeline templates can pack significant amount of logic within a single pipeline block, which reduces the total number of pipeline stages required and hence results in latency reduction. Although, N-Inverter implementation requires twice as many pipeline stages as N-P implementation, it results in a 1.85% lower overall latency. This could be attributed to the use slower pull-up logic stacks in N-P templates.

TABLE II

8 × 8-bit Array Multiplier Latency

| Pipeline Style | Latency |
| --- | --- |
| PCeHB | 663 ps |
| N-Inverter | 529 ps |
| N-P 539 | 539 ps |

In terms of the total transistor count, the N-Inverter and N-P implementations use 42.2% and 54.2% less transistors respectively than the PCeHB implementation as shown in Table III. The total transistor width in N-Inverter and N-P designs is 35.6% and 46% less respectively than that in the PCeHB implementation. This huge saving in the transistor count and width can be directly attributed to the packing of more logic stacks within a single pipeline block and the elimination of handshake logic for all intermediate nodes.

TABLE III

8 × 8-bit Array Multiplier Transistor Count and Width

| Pipeline Style | No. of Transistors | Width (μm) |
| --- | --- | --- |
| PCeHB | 17083 | 5290 |
| N-Inverter | 9864 | 3402 |
| N-P | 7819 | 2853 |

The choice of a particular pipeline implementation represents a design trade-off. Critical factors such as target throughput, logic complexity, power budget, latency range, total transistor count, noise margins, and timing robustness will have to be taken into account simultaneously before choosing a particular pipeline implementation. The N-P and N-Inverter templates represent a good energy efficient alternative to QDI templates, especially for logic computations which require a large number of inputs or outputs or those with multiple intermediate logic stages. We envision these circuits being used for large chunks of local logic (e.g. an array multiplier in a floating point unit) wrapped with QDI interfaces, rather than globally.

The above examples include two specific energy-efficient pipeline templates for high throughput asynchronous circuits. These two templates are N-P and N-Inverter pipelines based on single-track handshake protocol. Each pipeline contains multiple stages of logic. The handshake overhead is minimized by eliminating validity and neutrality detection logic gates for all input tokens as well as for all intermediate logic nodes. Both of these templates can pack significant amount of logic within each pipeline block, while still maintaining a fast cycle time of only 18 transitions. Stalls on inputs and outputs do not impact correct operation. A comprehensive noise analysis of dynamic gates within our templates shows sufficient noise margins across all process corners. Since our templates introduce multiple timing assumptions, we also analyzed the timing robustness of our pipelines. A completion detection scheme based on wide NOR gates is presented, which results in significant latency and energy savings especially as the number of outputs increase. Three separate full transistor-level pipeline implementations of an 8×8-bit boothencoded array multiplier are presented. Compared to the PCeHB implementation, the N-Inverter and N-P pipeline implementations reduced the energy-delay product by 38.5% and 44% respectively. The overall multiplier latency was reduced by 20.2% and 18.7%, while the total transistor width was reduced by 35.6% and 46% with N-Inverter and N-P pipeline templates respectively.

The following publications provide additional technical information of the described technology and are incorporated by reference herein in their entirety and for all purposes:

BEEREL, P., LINES, A., AND DAVIES, M. 2009. Logic synthesis of multi-level domino asynchronous pipelines. Fulcrum Microsystems, U.S. Pat. No. 7,584,449 B2, 2009.

BOOTH, A. D. 1951. A signed binary multiplication technique. Quarterly Journal of Mechanics and Applied Mathematics 4, 2, 236-240.

CHENG, F. C. 1998. Practical design and performance evaluation of completion detection circuits. In Proceedings of the International Conference on Computer Design, 1998.

CUMMINGS, U. V., LINES, A. M., AND MARTIN, A. J. 1994. An asynchronous pipeline lattice-structure filter. In Proceedings of the International Symposium on Advanced Research in Asynchronous Circuits and Systems, 1994.

D. FANG, J. T. AND MANOHAR, R. 2005. A high-performance asynchronous FPGA: Test results. In Proceedings of IEEE Symposium on Field-Programmable Custom Computing Machines, April 2005.

DALLY, W. J. AND POULTON, J. 1998. Digital Systems Engineering. Cambridge University Press, Cambridge, UK.

FANG, D. AND MANOHAR, R. 2004. Non-uniform access asynchronous register files. In Proceedings of IEEE International Symposium on Asynchronous Circuits and Systems, 2004.

FERRETTI, M. AND BEEREL, P. 2002. Single-track asynchronous pipeline templates using 1-of-n encoding. In Proceedings of the Conference on Design, Automation and Test in Europe (DATE), 2002.

HOROWITZ, M. 2007. Scaling, power and the future of CMOS. In Proceedings of the 20th International Conference on VLSI Design, 2007.

LAFRIEDA, C. AND MANOHAR, R. 2009. Reducing power consumption with relaxed quasi delay-insensitive circuits. In Proceedings of IEEE International Symposium on Asynchronous Circuits and Systems, 2009.

LINES, A. 1995. Pipelined asynchronous circuits. M.S. thesis, California Institute of Technology.

MARTIN, A. J. 1990. Programming in VLSI: from communicating processes to delay insensitive circuits. Addison-Wesley.

MARTIN, A. J., LINES, A., MANOHAR, R., NYSTROM, M., PENZES, P., SOUTHWORTH, R., CUMMINGS, U. V., AND LEE, T.-K. 1997. The design of an asynchronous MIPS R3000. In Proceedings of Conference on Advanced Research in VLSI, 1997.

SCHMOOKLER, M., PUTRINO, M., MATHER, A., TYLER, J., NGUYEN, H., ROTH, C., PHAM, M., LENT, J., AND SHARMA, M. 1999. A low-power, high-speed implementation of a PowerPC microprocessor vector extension. In Proceedings of the International Symposium on Computer Arithmetic, 1999.

SCHUSTER, S. AND COOK, P. 2003. Low-power synchronous-to-asynhronous interlocked pipelined CMOS circuits operating at 3.3-4.5 GHz. IEEE Journal of Solid-State Circuits 38, 4, 622-630.

SEITZ, C. L. 1980. System timing. In Introduction to VLSI Systems, C. A. Mead and L. A. Conway, Eds. Addison-Wesley.

SHEIKH, B. R. AND MANOHAR, R. 2010. An operand-optimized asynchronous IEEE 754 double-precision floating-point adder. In Proceedings of IEEE International Symposium on Asynchronous Circuits and Systems, 2010.

SUTHERLAND, I. AND FAIRBANKS, S. 2001. GasP: A minimal FIFO control. In Proceedings of IEEE International Symposium on Asynchronous Circuits and Systems, 2001.

TIAN, Z., YU, D., AND QIU, Y. 2002. A high effective algorithm of 32-bit multiply and MAC instructions' VLSI implementation with 32×8 multiplier-accumulator in DSP applications. In Proceedings of the International Conference on Signal Processing, 2002.

TRONG, S. D., SCHMOOKLER, M., SCHWARZ, E. M., AND KROENER, M. 2007. P6 binary floating-point unit. In Proceedings of the International Symposium on Computer Arithmetic, 2007.

VAN BERKEL, K. AND BINK, A. 1996. Single-track handshake signalling with application to micropipelines and handshake circuits. In Proceedings of the International Symposium on Asynchronous Circuits and Systems, 1996.

WESTE, N. AND HARRIS, D. 2004. CMOS VLSI Design: A Circuits and Systems Perspective. Addison-Wesley.

WILLIAMS, T. E. 1991. Self-timed rings and their application to division. Ph.D. thesis, Computer Systems Lab, Stanford University.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is what is described and illustrated, including:

1. A device for asynchronous processing without synchronization to a common clock, comprising:
two or more asynchronous circuits that are connected to form an asynchronous processing pipeline, each asynchronous circuit including:
first input conductive wires that receive and carry a first input signal,
a first input acknowledgment conductive wire that receives a first input acknowledgment signal from another asynchronous circuit that produces the received first input signal;
a first asynchronous processing module that processes the first input signal to produce a first output signal;
a first completion detection processing module that receives the first input acknowledgment signal and the first output signal from the first asynchronous processing module and is operable to produce a first output acknowledgment signal indicating completion of processing of the received first input signal and generation of the first output signal;
a first output acknowledgment conductive wire that receives the first output acknowledgment signal from the first completion detection processing module and outputs the first output acknowledgment signal; and
first output conductive wires that receive and carry the first output signal generated by the first asynchronous processing module,
wherein:
the first asynchronous processing module includes:
a first pull-down logic circuit connected to the first input conductive wires, and
a first pull-up logic circuit connected to receive output of the first pull-down logic circuit and operable to produce an output based on which the first output signal is generated.

2. The device as in claim 1, wherein:
the first input signal carried by the first input conductive wires is encoded by having only a single wire of the first input conductive wires asserted at a time; and
the first output signal carried by the first output conductive wires is encoded by having only a single wire of the first output conductive wires asserted at a time.

3. The device as in claim 1, wherein:
a number of the first input conductive wires is different from a number of the first output conductive wires.

4. The device as in claim 1, wherein:
a number of the first input conductive wires is equal to a number of the first output conductive wires.

5. The device as in claim 1, wherein:
the first asynchronous processing module further includes:
a second pull-down logic circuit connected to receive the output of the first pull-up logic circuit, and
a second pull-up logic circuit connected to receive output from the second pull-down logic circuit and operable to produce an output based on which the first output signal is generated.

6. The device as in claim 1, wherein each asynchronous circuit further includes:
second input conductive wires that receive and carry a second input signal,
a second input acknowledgment conductive wire that receives a second input acknowledgment signal from another asynchronous circuit that produces the received second input signal;
a second asynchronous processing module that processes the second input signal to produce a second output signal; and
second output conductive wires that receive and carry the second output signal generated by the second asynchronous processing module.

7. The device as in claim 6, wherein:
the first input signal and the second input signal are different.

8. The device as in claim 1, comprising:
the first completion detection processing module is coupled to the first input conductive wires and is operable to reset signals on the first input conductive wires after completion of processing of the received first input signal by the first asynchronous processing module and generation of the first output signal.

9. The device as in claim 1, wherein:
two adjacently connected asynchronous circuits in the asynchronous processing pipeline communicate via the first output conductive wires and the first output acknowledgment conductive wire of one of the two adjacently connected asynchronous circuits that is upstream relative to the other asynchronous circuit without having an acknowledgment feedback from the downstream asynchronous circuit to the upstream asynchronous circuit.

10. A device for asynchronous processing without synchronization to a common clock, comprising:
two or more asynchronous circuits that are connected to form an asynchronous processing pipeline, each asynchronous circuit including:
first input conductive wires that receive and carry a first input signal,
a first input acknowledgment conductive wire that receives a first input acknowledgment signal from another asynchronous circuit that produces the received first input signal;
a first asynchronous processing module that processes the first input signal to produce a first output signal;
a first completion detection processing module that receives the first input acknowledgment signal and the first output signal from the first asynchronous processing module and is operable to produce a first output acknowledgment signal indicating completion of processing of the received first input signal and generation of the first output signal;
a first output acknowledgment conductive wire that receives the first output acknowledgment signal from the first completion detection processing module and outputs the first output acknowledgment signal; and
first output conductive wires that receive and carry the first output signal generated by the first asynchronous processing module,
wherein:
the first asynchronous processing module includes:
a first pull-down logic circuit connected to the first input conductive wires,
a first inverter circuit connected to receive output of the first pull-down logic circuit,
a second pull-down logic circuit connected to receive the output of the first inverter circuit, and a pull-up transistor connected to receive output from the second pull-down logic circuit and operable to produce an output based on which the first output signal is generated.

11. The device as in claim 10, wherein:
the first input signal carried by the first input conductive wires is encoded by having only a single wire of the first input conductive wires asserted at a time; and
the first output signal carried by the first output conductive wires is encoded by having only a single wire of the first output conductive wires asserted at a time.

12. The device as in claim 10, wherein:
a number of the first input conductive wires is different from a number of the first output conductive wires.

13. The device as in claim 10, wherein:
a number of the first input conductive wires is equal to a number of the first output conductive wires.

14. The device as in claim 10, wherein each asynchronous circuit further includes:
second input conductive wires that receive and carry a second input signal,
a second input acknowledgment conductive wire that receives a second input acknowledgment signal from another asynchronous circuit that produces the received second input signal;
a second asynchronous processing module that processes the second input signal to produce a second output signal; and
second output conductive wires that receive and carry the second output signal generated by the second asynchronous processing module.

15. The device as in claim 14, wherein:
the first input signal and the second input signal are different.

16. The device as in claim 10, comprising:
the first completion detection processing module is coupled to the first input conductive wires and is operable to reset signals on the first input conductive wires after completion of processing of the received first input signal by the first asynchronous processing module and generation of the first output signal.

17. The device as in claim 10, wherein:
two adjacently connected asynchronous circuits in the asynchronous processing pipeline communicate via the first output conductive wires and the first output acknowledgment conductive wire of one of the two adjacently connected asynchronous circuits that is upstream relative to the other asynchronous circuit without having an acknowledgment feedback from the downstream asynchronous circuit to the upstream asynchronous circuit.

18. A device for asynchronous processing without synchronization to a common clock, comprising:
two or more asynchronous circuits that are connected to form an asynchronous processing pipeline, each asynchronous circuit including:
first input conductive wires that receive and carry a first input signal,
a first input acknowledgment conductive wire that receives a first input acknowledgment signal from another asynchronous circuit that produces the received first input signal;
a first asynchronous processing module that processes the first input signal to produce a first output signal;
a first completion detection processing module that receives the first input acknowledgment signal and the first output signal from the first asynchronous processing module and is operable to produce a first output acknowledgment signal indicating completion of processing of the received first input signal and generation of the first output signal;
a first output acknowledgment conductive wire that receives the first output acknowledgment signal from the first completion detection processing module and outputs the first output acknowledgment signal; and
first output conductive wires that receive and carry the first output signal generated by the first asynchronous processing module,
wherein each asynchronous circuit further includes:
second input conductive wires that receive and carry a second input signal,
a second input acknowledgment conductive wire that receives a second input acknowledgment signal from another asynchronous circuit that produces the received second input signal;
a second asynchronous processing module that processes the second input signal to produce a second output signal; and
second output conductive wires that receive and carry the second output signal generated by the second asynchronous processing module, and
wherein:
the two or more asynchronous circuits that are connected to form the processing pipeline include a first downstream asynchronous circuit that is connected to the first output conductive wires to receive the first output signal,
wherein the device further comprises a second downstream asynchronous circuit that is connected to the second output conductive wires to receive the second output signal,
wherein the first completion detection processing module is coupled to further receive the second output signal from the second asynchronous processing module and is operable to produce the first output acknowledgment signal indicating completion of both processing of the received second input signal by the second asynchronous processing module and processing of the received first input signal by the first asynchronous processing module and generation of the first and second output signals, and
wherein the first and second downstream asynchronous circuits are coupled to receive a copy of the first output acknowledgment signal.

19. A device for asynchronous processing without synchronization to a common clock, comprising:
two or more asynchronous circuits that are connected to form an asynchronous processing pipeline, each asynchronous circuit including:
first input conductive wires that receive and carry a first input signal,
a first input acknowledgment conductive wire that receives a first input acknowledgment signal from another asynchronous circuit that produces the received first input signal;
a first asynchronous processing module that processes the first input signal to produce a first output signal;
a first completion detection processing module that receives the first input acknowledgment signal and the first output signal from the first asynchronous processing module and is operable to produce a first output acknowledgment signal indicating completion of processing of the received first input signal and generation of the first output signal;

a first output acknowledgment conductive wire that receives the first output acknowledgment signal from the first completion detection processing module and outputs the first output acknowledgment signal; and
first output conductive wires that receive and carry the first output signal generated by the first asynchronous processing module,
wherein the first completion detection processing module is coupled to the first input conductive wires and is operable to reset signals on the first input conductive wires after completion of processing of the received first input signal by the first asynchronous processing module and generation of the first output signal,
wherein:
the first completion detection processing module includes a discharge circuit that is coupled to the first input conductive wires to produce a discharge signal that resets the first input conductive wires, and
wherein the discharge circuit includes an NOR gate that produces an NOR gate output as the discharge signal and receives a first signal generated by the first completion detection processing module and associated with the first output acknowledgment signal, and a second signal generated by the first completion detection processing module and associated with the first output acknowledgment signal with a delay relative to the first signal.

20. The device as in claim 19, wherein:
the discharge circuit includes a discharge pulse generator that produces the second signal with the delay.

21. The device as in claim 20, wherein:
the discharge pulse generator includes a series of inverters to generate the delay in a way that provides an extra delay for improving timing margin and robustness of the asynchronous processing.

22. The device as in claim 19, wherein:
the first input signal carried by the first input conductive wires is encoded by having only a single wire of the first input conductive wires asserted at a time; and
the first output signal carried by the first output conductive wires is encoded by having only a single wire of the first output conductive wires asserted at a time.

23. The device as in claim 19, wherein:
a number of the first input conductive wires is different from a number of the first output conductive wires.

24. The device as in claim 19, wherein:
a number of the first input conductive wires is equal to a number of the first output conductive wires.

25. The device as in claim 19, wherein each asynchronous circuit further includes:
second input conductive wires that receive and carry a second input signal,
a second input acknowledgment conductive wire that receives a second input acknowledgment signal from another asynchronous circuit that produces the received second input signal;
a second asynchronous processing module that processes the second input signal to produce a second output signal; and
second output conductive wires that receive and carry the second output signal generated by the second asynchronous processing module.

26. The device as in claim 25, wherein:
the first input signal and the second input signal are different.

27. The device as in claim 19, comprising:
the first completion detection processing module is coupled to the first input conductive wires and is operable to reset signals on the first input conductive wires after completion of processing of the received first input signal by the first asynchronous processing module and generation of the first output signal.

28. The device as in claim 19, wherein:
two adjacently connected asynchronous circuits in the asynchronous processing pipeline communicate via the first output conductive wires and the first output acknowledgment conductive wire of one of the two adjacently connected asynchronous circuits that is upstream relative to the other asynchronous circuit without having an acknowledgment feedback from the downstream asynchronous circuit to the upstream asynchronous circuit.

29. A method for asynchronous processing without synchronization to a common clock, comprising:
connecting asynchronous circuits in series to form an asynchronous processing pipeline to allow one asynchronous circuit to communicate with next adjacent asynchronous circuit to communicate while permitting each asynchronous circuit to perform signal processing, without a common clock;
operating two adjacently connected asynchronous circuits in the asynchronous processing pipeline to communicate by directing signals from one of the two adjacently connected asynchronous circuits that is upstream relative to the other asynchronous circuit without having an acknowledgment feedback from the downstream asynchronous circuit to the upstream asynchronous circuit;
operating each asynchronous circuit to encode an input or output signal by using a plurality of conductive wires to carry the input or output signal and by having only a single wire of the plurality of conductive wires asserted at a time;
operating each asynchronous circuit to use a single conductive wire, which is additional to the conductive wires for carrying output signal from the upstream asynchronous circuit to the downstream asynchronous circuit, to send an acknowledgment signal to the downstream asynchronous circuit; and
configuring an asynchronous circuit in the asynchronous processing pipeline to include two or more asynchronous processing stages,
wherein:
the asynchronous circuit includes:
a first pull-down logic circuit connected to the input conductive wires,
a first pull-up logic circuit connected to receive output of the first pull-down logic circuit and operable to produce an output based on which the output signal is generated;
a second pull-down logic circuit connected to receive the output of the first pull-up logic circuit, and
a second pull-up logic circuit connected to receive output from the second pull-down logic circuit and operable to produce an output based on which the output signal is generated.

30. The method as in claim 29, wherein:
each asynchronous circuit includes:
input conductive wires that receive and carry an input signal, an input acknowledgment conductive wire that receives an input acknowledgment signal from an upstream asynchronous circuit that produces the received input signal;

an asynchronous processing module that processes the input signal to produce an output signal;

a completion detection processing module that receives the input acknowledgment signal and the output signal from the asynchronous processing module and is operable to produce an output acknowledgment signal indicating completion of processing of the received input signal and generation of the output signal;

an output acknowledgment conductive wire that receives the output acknowledgment signal from the completion detection processing module and outputs the output acknowledgment signal; and output conductive wires that receive and carry the output signal generated by the asynchronous processing module, wherein the method further includes:

resetting signals on the input conductive wires after completion of processing of the received input signal by the asynchronous processing module and generation of the output signal.

31. The method as in claim 30, comprising:

causing a delay in resetting the signals on the input conductive wires to improve timing margin and robustness of the asynchronous processing.

32. The method as in claim 30, wherein:

a number of the input conductive wires is different from a number of the output conductive wires.

33. A method for asynchronous processing without synchronization to a common clock, comprising:

connecting asynchronous circuits in series to form an asynchronous processing pipeline to allow one asynchronous circuit to communicate with next adjacent asynchronous circuit to communicate while permitting each asynchronous circuit to perform signal processing, without a common clock;

operating two adjacently connected asynchronous circuits in the asynchronous processing pipeline to communicate by directing signals from one of the two adjacently connected asynchronous circuits that is upstream relative to the other asynchronous circuit without having an acknowledgment feedback from the downstream asynchronous circuit to the upstream asynchronous circuit;

operating each asynchronous circuit to encode an input or output signal by using a plurality of conductive wires to carry the input or output signal and by having only a single wire of the plurality of conductive wires asserted at a time;

operating each asynchronous circuit to use a single conductive wire, which is additional to the conductive wires for carrying output signal from the upstream asynchronous circuit to the downstream asynchronous circuit, to send an acknowledgment signal to the downstream asynchronous circuit; and configuring an asynchronous circuit in the asynchronous processing pipeline to include two or more asynchronous processing stages, wherein:

the asynchronous circuit includes:

a first pull-down logic circuit connected to the first input conductive wires, a first inverter circuit connected to receive output of the first pull-down logic circuit, a second pull-down logic circuit connected to receive the output of the first inverter circuit, and a pull-up transistor connected to receive output from the second pull-down logic circuit and operable to produce an output based on which the output signal is generated.

34. The method as in claim 33, wherein:

each asynchronous circuit includes:

input conductive wires that receive and carry an input signal, an input acknowledgment conductive wire that receives an input acknowledgment signal from an upstream asynchronous circuit that produces the received input signal;

an asynchronous processing module that processes the input signal to produce an output signal;

a completion detection processing module that receives the input acknowledgment signal and the output signal from the asynchronous processing module and is operable to produce an output acknowledgment signal indicating completion of processing of the received input signal and generation of the output signal;

an output acknowledgment conductive wire that receives the output acknowledgment signal from the completion detection processing module and outputs the output acknowledgment signal; and output conductive wires that receive and carry the output signal generated by the asynchronous processing module, wherein the method further includes:

resetting signals on the input conductive wires after completion of processing of the received input signal by the asynchronous processing module and generation of the output signal.

35. The method as in claim 34, comprising:

causing a delay in resetting the signals on the input conductive wires to improve timing margin and robustness of the asynchronous processing.

36. The method as in claim 34, wherein:

a number of the input conductive wires is different from a number of the output conductive wires.

* * * * *

UNITED STATES PATENT AND TRADEMARK OFFICE
CERTIFICATE OF CORRECTION

PATENT NO. : 9,633,157 B2
APPLICATION NO. : 14/236903
DATED : April 25, 2017
INVENTOR(S) : Rajit Manohar and Basit Riaz Sheikh It is certified that error appears in the above-identified patent and that said Letters Patent is hereby corrected as shown below:

In the Specification

In Column 3, Line 37, delete "11C-Element" and insert -- 11 C-Element --.

In Column 4, Line 65, delete "acknowledge" and insert -- acknowledge signal --.

In Column 11, Line 46, delete "out-put" and insert -- output --.

In Column 17, Line 65, delete "energydelay" and insert -- energy delay --.

In Column 19, Line 8, delete "boothencoded" and insert -- booth encoded --.

In Column 20, Lines 7-8, delete "Low-power synchronous-to-asynhronous" and insert -- Low-power synchronous-to-asynchronous --.

Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*